United States Patent
Kim et al.

(10) Patent No.: US 11,302,414 B2
(45) Date of Patent: Apr. 12, 2022

(54) STORAGE DEVICE THAT PERFORMS RUNTIME REPAIR OPERATION BASED ON ACCUMULATED ERROR INFORMATION AND OPERATION METHOD THEREOF

(71) Applicant: SAMSUNG ELECTRONICS CO., LTD., Suwon-si (KR)

(72) Inventors: Dong Kim, Hwaseong-si (KR); Hyunglae Eun, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 192 days.

(21) Appl. No.: 16/351,118

(22) Filed: Mar. 12, 2019

(65) Prior Publication Data
US 2020/0058365 A1 Feb. 20, 2020

(30) Foreign Application Priority Data
Aug. 14, 2018 (KR) .......................... 10-2018-0095016

(51) Int. Cl.
G06F 11/00 (2006.01)
G11C 29/00 (2006.01)
G06F 11/10 (2006.01)

(52) U.S. Cl.
CPC .......... *G11C 29/70* (2013.01); *G06F 11/1068* (2013.01)

(58) Field of Classification Search
CPC .. G06F 11/008; G06F 11/106; G06F 11/1072; G06F 3/0613; G06F 3/0619; G06F 3/0616; G06F 3/0653
See application file for complete search history.

(56) References Cited

U.S. PATENT DOCUMENTS

| | | | |
|---|---|---|---|
| 4,479,214 A * | 10/1984 | Ryan | G06F 11/10 714/702 |
| 6,967,868 B2 | 11/2005 | Kim et al. | |
| 7,895,482 B2 | 2/2011 | Fischer et al. | |
| 8,793,556 B1 * | 7/2014 | Northcott | G06F 11/1068 714/773 |
| 9,165,679 B2 | 10/2015 | Oh et al. | |
| 9,424,953 B2 | 8/2016 | Hirano | |
| 9,704,601 B2 | 7/2017 | Oh et al. | |
| 9,786,390 B2 | 10/2017 | Kim | |
| 9,859,023 B2 | 1/2018 | Kim et al. | |
| 9,965,346 B2 | 5/2018 | Cadigan et al. | |
| 2002/0091965 A1 * | 7/2002 | Moshayedi | G06F 11/073 714/6.13 |

(Continued)

OTHER PUBLICATIONS

Google Patents/Scholar—text refined (Year: 2021).*

(Continued)

*Primary Examiner* — Christopher S McCarthy
(74) *Attorney, Agent, or Firm* — Volentine, Whitt & Francos, PLLC

(57) ABSTRACT

A storage device including a nonvolatile memory device, a dynamic random access memory (DRAM) device, and a storage controller, an operation method of the storage device including performing an access operation on the DRAM device, collecting accumulated error information about the DRAM device based on the access operation, detecting a fail row of the DRAM device based on the accumulated error information, and performing a runtime repair operation on the detected fail row.

16 Claims, 20 Drawing Sheets

(56) References Cited

U.S. PATENT DOCUMENTS

| | | | |
|---|---|---|---|
| 2005/0013165 A1* | 1/2005 | Ban | G06F 11/1068 365/185.2 |
| 2007/0083626 A1* | 4/2007 | Walker | G06F 21/805 709/223 |
| 2008/0055989 A1* | 3/2008 | Lee | G11C 29/76 365/185.09 |
| 2009/0125761 A1* | 5/2009 | Lu | G11C 29/70 714/718 |
| 2010/0180068 A1* | 7/2010 | Matsumoto | G06F 11/1441 711/103 |
| 2010/0235713 A1* | 9/2010 | Lee | G06F 11/1072 714/763 |
| 2013/0111296 A1* | 5/2013 | Jung | G11C 11/00 714/755 |
| 2013/0227344 A1* | 8/2013 | Sohn | G11C 29/44 714/6.21 |
| 2014/0078842 A1* | 3/2014 | Oh | G11C 29/785 365/200 |
| 2014/0136883 A1* | 5/2014 | Cohen | G11C 16/349 714/6.11 |
| 2014/0237165 A1* | 8/2014 | Seo | G06F 12/0246 711/103 |
| 2014/0247677 A1 | 9/2014 | Sohn et al. | |
| 2015/0012685 A1* | 1/2015 | Avila | G11C 16/3418 711/103 |
| 2015/0287480 A1* | 10/2015 | Wilson | G11C 11/418 365/96 |
| 2016/0203044 A1 | 7/2016 | Kwon et al. | |
| 2017/0068607 A1* | 3/2017 | Herzi | G06F 13/24 |
| 2017/0131947 A1* | 5/2017 | Hoang | G06F 11/00 |
| 2017/0131948 A1* | 5/2017 | Hoang | G06F 3/0653 |
| 2017/0161143 A1* | 6/2017 | Reed | G11C 11/4093 |
| 2017/0169905 A1* | 6/2017 | Walton | G06F 3/0619 |
| 2017/0344421 A1* | 11/2017 | Brandl | G06F 3/0619 |
| 2018/0166150 A1* | 6/2018 | Lee | G11C 29/00 |

OTHER PUBLICATIONS

Google Scholar/Patents—text refined (Year: 2021).*
Dae-Hyun Kim et al., "ECC-ASPIRIN: An ECC-Assited Post-Package Repair Scheme for Aging Errors in DRAMs", 2016 IEEE 34th VLSI Test Symposium (VTS).

* cited by examiner

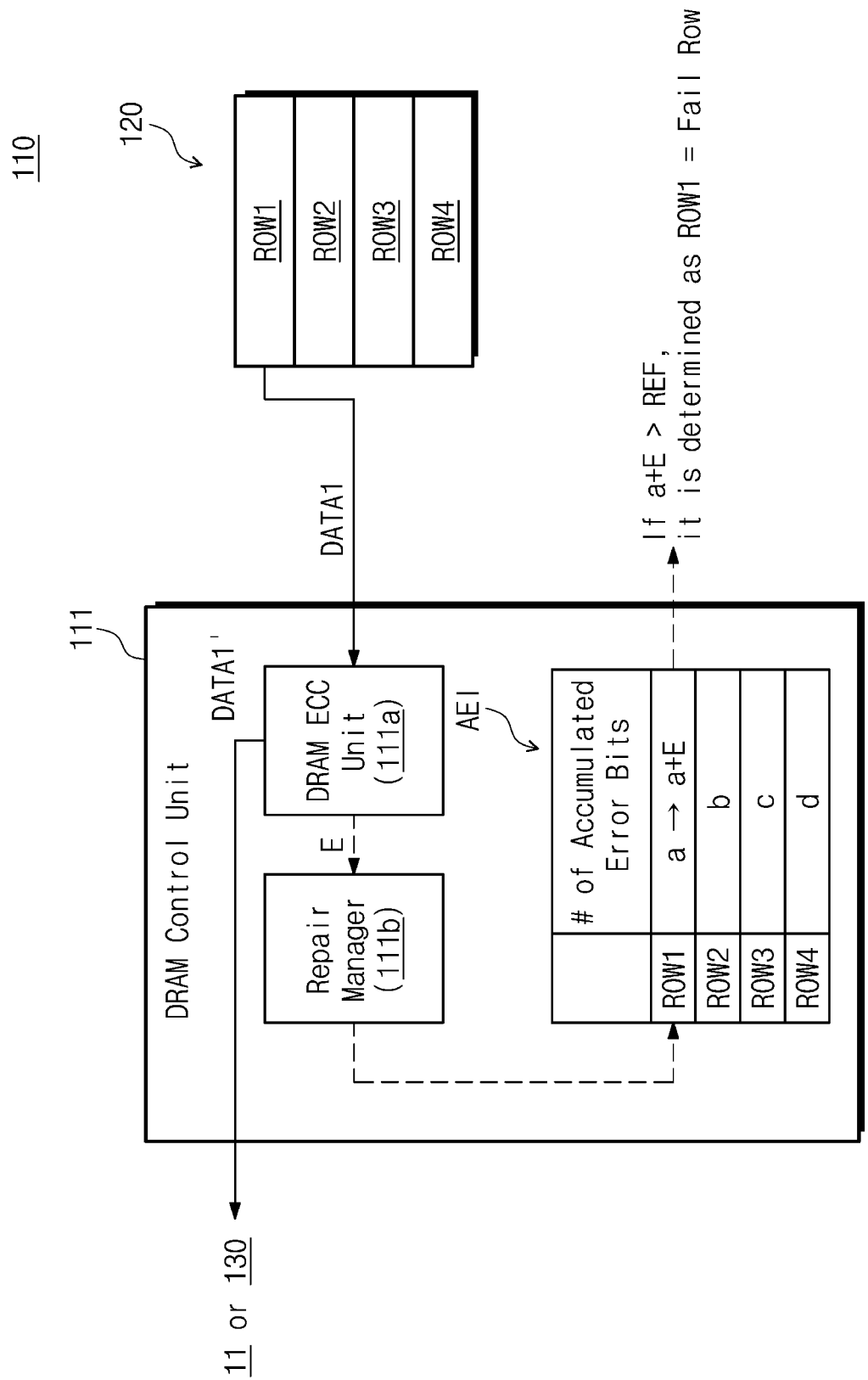

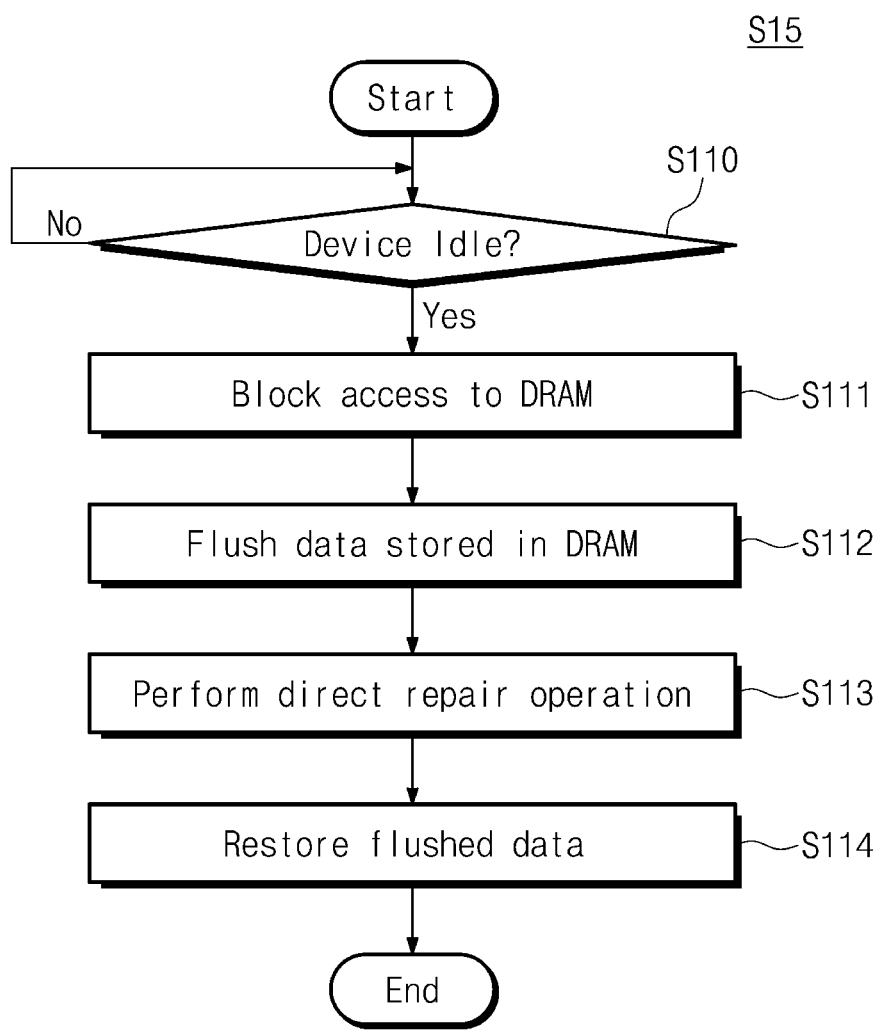

STORAGE DEVICE THAT PERFORMS RUNTIME REPAIR OPERATION BASED ON ACCUMULATED ERROR INFORMATION AND OPERATION METHOD THEREOF

CROSS-REFERENCE TO RELATED APPLICATIONS

A claim of priority under 35 U.S.C. § 119 is made to Korean Patent Application No. 10-2018-0095016 filed on Aug. 14, 2018, in the Korean Intellectual Property Office, the entirety of which is hereby incorporated by.

BACKGROUND

The present disclosure relates to semiconductor memories, and more particularly to storage devices and methods of operating storage devices.

Semiconductor memories may be classified into volatile memory devices such as static random access memory (SRAM) or dynamic random access memory (DRAM) in which stored data is lost when power is interrupted, and nonvolatile memory devices such as flash memory, phase-change RAM (PRAM), magnetic RAM (MRAM), resistive RAM (RRAM), or ferroelectric RAM (FRAM) in which stored data is retained even when power is interrupted.

Solid state drives (SSD) based on flash memory are widely used as high-capacity storage mediums of computing devices. SSDs are typically configured to store data to flash memory, and use a dynamic random access memory (DRAM) device as buffer memory for the purpose of storing various information for managing the flash memory. In the case where a fault is detected in a DRAM device in the process of manufacturing the DRAM device, a fault cell may be repaired through various repair schemes. However, in the case where a fault occurs in a DRAM device after the DRAM device is completely manufactured and mounted in an SSD device (i.e., in the case where the SSD device is provided to and used by an end user), the SSD device in addition to the DRAM device may fail to operate normally.

SUMMARY

Embodiments of the inventive concept provide a storage device with improved reliability and improved lifespan and an operation method thereof.

Embodiments of the inventive concepts provides an operation method of a storage device including a nonvolatile memory device, a dynamic random access memory (DRAM) device including a plurality of rows, and a storage controller. The operation method of the storage device includes performing, by the storage controller, an access operation on the DRAM device; collecting, by the storage controller, accumulated error information about the DRAM device based on the access operation; detecting, by the storage controller, a fail row from among the plurality of rows of the DRAM device based on the accumulated error information; and performing, by the storage controller, a runtime repair operation on the fail row.

Embodiments of the inventive concepts further provide a storage device including a nonvolatile memory device; a dynamic random access memory (DRAM) device; and a storage controller that controls the nonvolatile memory device and the DRAM device. The storage controller includes a DRAM error correction unit that performs an error detection and correction operation on data read from the DRAM device; and a repair manager that manages accumulated error information based on an error detected by the DRAM error correction unit, detects a fail row of the DRAM device based on the accumulated error information, and performs a runtime repair operation on the fail row.

Embodiments of the inventive concepts still further provide an operation method of a storage device including a nonvolatile memory device, a volatile memory device, and a storage controller that controls the nonvolatile memory device and the volatile memory device. The operation method includes reading, by the storage controller, data from the volatile memory device; performing, by the storage controller, an error detection and correction operation on the read data; updating, by the storage controller, accumulated error information about each of a plurality of rows of the volatile memory device based on a result of the error detection and correction operation; detecting, by the storage controller, a fail row of the volatile memory device based on the updated accumulated error information; and performing, by the storage controller, a runtime repair operation on the fail row. The runtime repair operation is performed while the storage device operates.

Embodiments of the inventive concepts also provide a computer system including a storage device, and host configured to control the storage device. The storage device includes a nonvolatile memory device; a dynamic random access memory (DRAM) device including a plurality of rows; and a storage controller configured to collect accumulated error information about the DRAM device based on data read from the DRAM device, detect a fail row from among the plurality of rows of the DRAM device based on the accumulated error information, and perform a runtime repair operation on the fail row during run-time of the storage device.

BRIEF DESCRIPTION OF THE FIGURES

The above and other objects and features of the inventive concepts will become apparent in view of the following detailed description of exemplary embodiments taken with reference to the accompanying drawings.

FIG. 4 illustrates a diagram descriptive of operation S13 and operation S14 of FIG. 3.

FIG. 5 illustrates a flowchart of operation S15 of FIG. 3.

DETAILED DESCRIPTION

Hereinafter, embodiments of the inventive concepts will be described in detail and clearly to such an extent that one of skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, integrated circuit cores, microprocessors, microcontrollers, computers, memory circuits, passive electronic components, active electronic components, optical components, hardwired electrical circuits, hardwired electronic circuits, pressure sensors, micromechanical systems (MEMS) and the like or a combination thereof, and may optionally be driven by firmware and/or software. For example, software may be machine code, firmware, embedded code, or application software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive.

Figure 1:
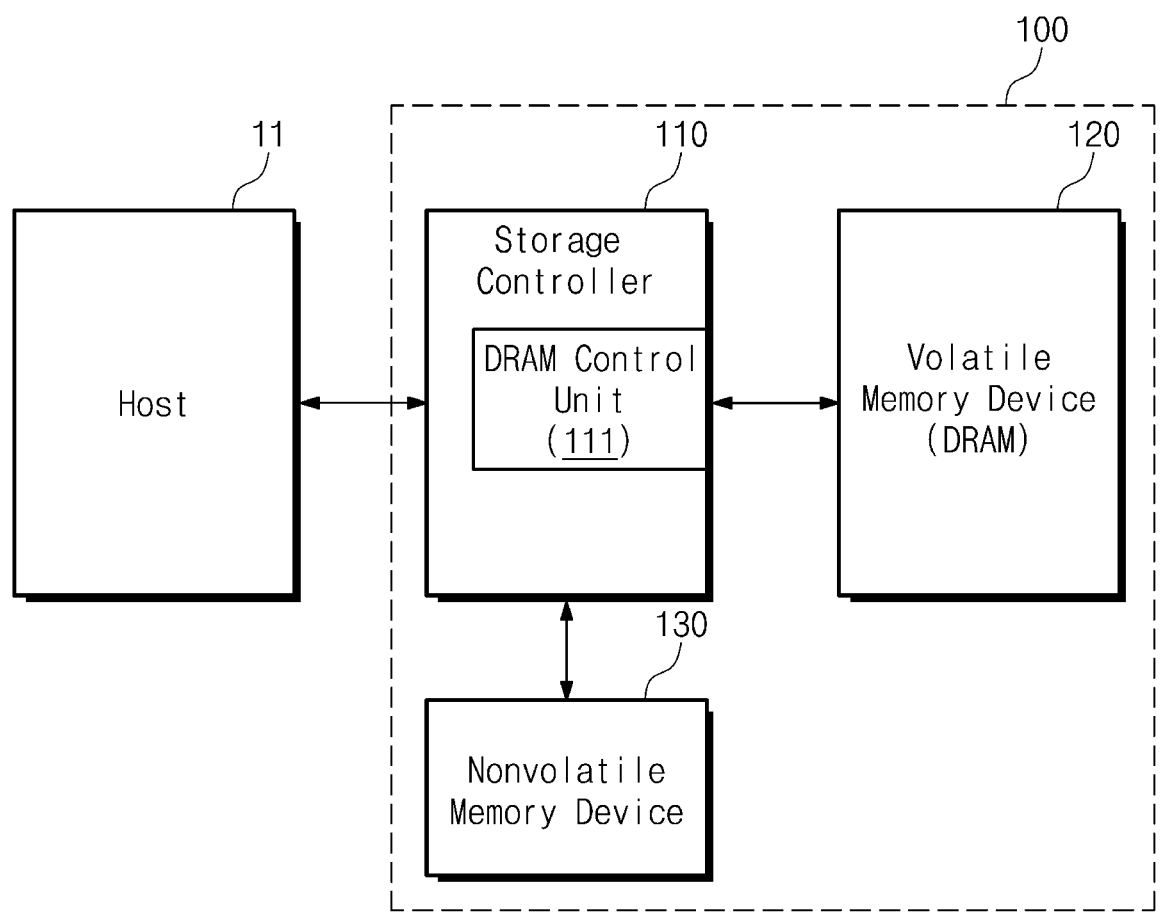
FIG. 1 illustrates a block diagram of a computing system according to an embodiment of the inventive concepts.

FIG. 1 illustrates a block diagram of a computing system according to an embodiment of the inventive concepts. Referring to FIG. 1, computing system 10 includes host 11 and storage device 100. In an exemplary embodiment, the computing system 10 may include for example a computer, a portable computer, a ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, or one of various electronic devices including a home network, or the like.

The host 11 may be configured to control the storage device 100. For example, the host 11 may be configured to store data to (e.g., in) the storage device 100 or to read data stored in the storage device 100.

The storage device 100 includes a storage controller 110, a volatile memory device 120, and a nonvolatile memory device 130. In an exemplary embodiment, the storage device 100 may be a high-capacity storage medium such as for example a solid state drive (SSD) or a memory card. Under control of the host 11, the storage controller 110 may store data to the nonvolatile memory device 130 or may read data stored in the nonvolatile memory device 130.

The volatile memory device 120 may be used as a working memory of the storage device 100. For example, the storage controller 110 may store various information (e.g., metadata information and a mapping table) necessary for operation of the storage device 100 to the volatile memory device 120, and may access the nonvolatile memory device 130 based on the information stored in the volatile memory device 120. Alternatively, the volatile memory device 120 may be used as a buffer memory of the storage device 100. For example, write data received from the host 11 or data read from the nonvolatile memory device 130 may be temporarily stored to the volatile memory device 120.

Hereinafter, in the following description it is assumed that the volatile memory device 120 included in the storage device 100 is a dynamic random access memory (DRAM) device. However, the inventive concepts are not so limited, and the volatile memory device 120 may for example be any one of various memory devices supporting high-speed operation. Hereinafter, the volatile memory device 120 may be referred to as DRAM device 120.

The storage controller 110 includes a DRAM control unit 111. The DRAM control unit 111 may be configured to control the DRAM device 120. For example, the DRAM control unit 111 may be configured to access the DRAM device 120 under control of the storage controller 110.

In an exemplary embodiment, the DRAM control unit 111 may perform a runtime repair operation on the DRAM device 120. The runtime repair operation may indicate a repair operation which is performed on a fail row (i.e., a failed row) occurring at the DRAM device 120 while the storage device 100 is driven or at run-time. That is, even though the storage device 100 is operating (e.g., driven or at run-time such as in the case of use by an end user after manufacture), the DRAM control unit 111 may perform the repair operation on the fail row occurring at the DRAM device 120. Accordingly, even though a fail row occurs at the DRAM device 120, the DRAM device 120 and/or the storage device 100 may operate normally.

In an exemplary embodiment, the DRAM control unit 111 may manage accumulated error information about each of a plurality of rows of the DRAM device 120 and may detect a fail row based on the accumulated error information. The DRAM control unit 111 may perform the runtime repair operation on the detected fail row. In an exemplary embodiment, the runtime repair operation according to an embodiment of the inventive concepts may be performed based on various schemes. Various schemes associated with the runtime repair operation according to embodiments of the inventive concepts will be more fully described subsequently with reference to the following drawings.

As described above, according to embodiments of the inventive concepts, while the storage device 100 is being driven, even though a fail row occurs at the DRAM device 120, the DRAM device 120 or the storage device 100 may operate normally by performing the runtime repair operation on the fail row. Accordingly, the reliability of the DRAM device 120 or the storage device 100 may be improved, and the lifespan thereof may be improved.

Figure 2:
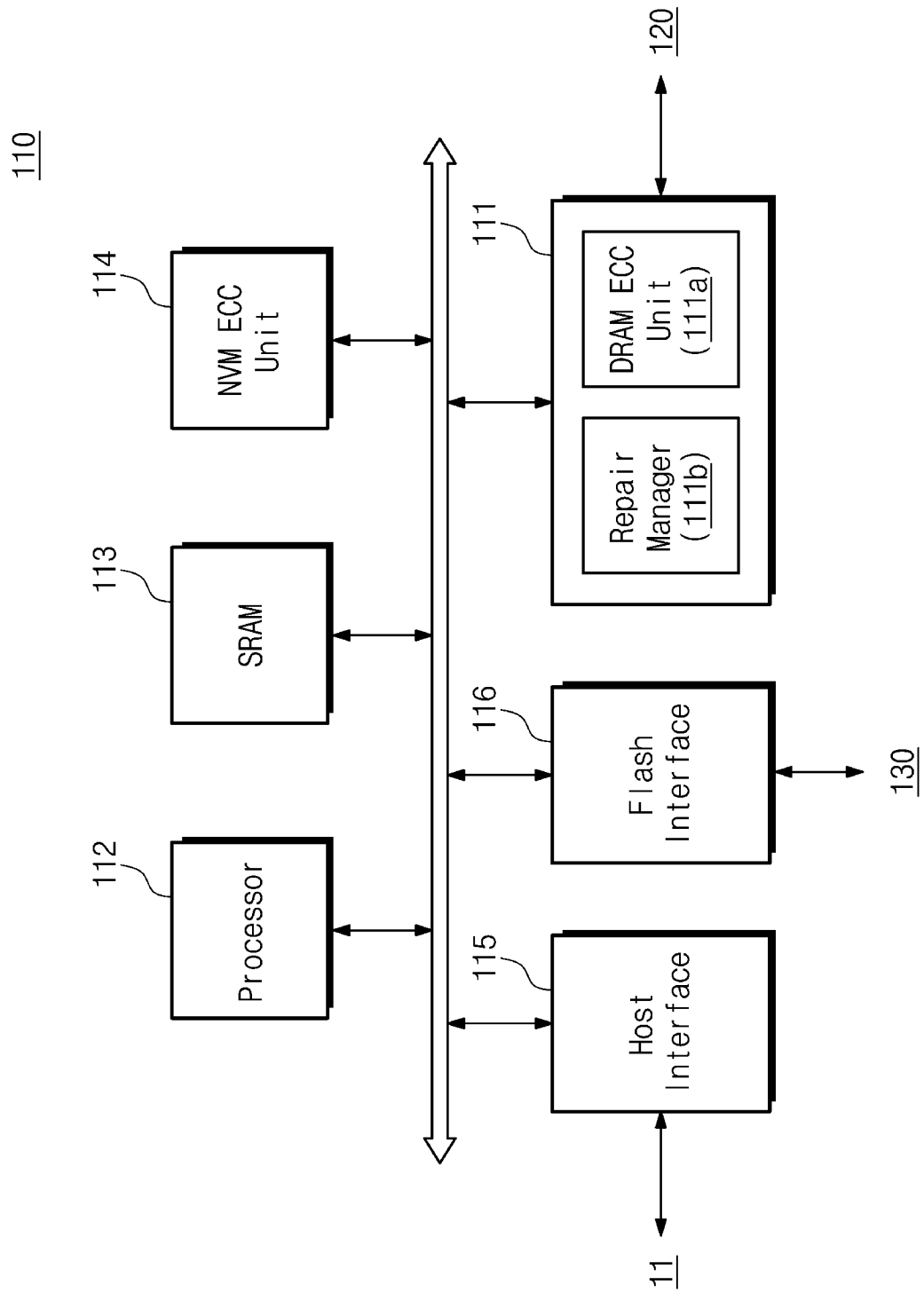
FIG. 2 illustrates a block diagram of a storage controller of FIG. 1.

FIG. 2 illustrates a block diagram of a storage controller of FIG. 1. Referring to FIG. 2, the storage controller 110 includes the DRAM control unit 111, a processor 112, an SRAM 113, a nonvolatile memory error correction code (ECC) unit 114, a host interface 115, and a flash interface 116.

The DRAM control unit 111 may be configured to perform an access operation on the DRAM device 120 under control of the storage controller 110. For example, the processor 112 may access the DRAM device 120 for the purpose of controlling overall operations of the storage controller 110. The processor 112 may generate a DRAM address for accessing the DRAM device 120. The DRAM control unit 111 may perform an access operation on an area corresponding to the DRAM address provided from the processor 112.

In an exemplary embodiment, the DRAM control unit 111 may communicate with the DRAM device 120 based on a high-speed interface such as for example a double data rate (DDR) interface, a low-power DDR (LPDDR) interface, or a graphic DDR (GDDR) interface, or the like.

The DRAM control unit 111 may include a DRAM ECC unit 111a and a repair manager 111b. The DRAM ECC unit 111a may perform error detection and correction on data read from the DRAM device 120. In an exemplary embodiment, a result of the error detection may be provided to the repair manager 111b.

The repair manager 111b may manage accumulated error information about the DRAM device 120 based on the error detection result of the DRAM ECC unit 111a. For example, the repair manager 111b may manage accumulated error information about each of a plurality of rows in the DRAM device 120 based on the error detection result of the DRAM ECC unit 111a. The accumulated error information may be a value obtained by accumulating the number of error bits occurring at each row of the DRAM device 120.

In detail, in the case where "k" error bits are detected while the DRAM control unit 111 performs an access operation on a first row of the DRAM device 120 as much as "n" times (here, the "k" error bits may occur at a particular access operation of the "n" access operations or may occur in a plurality of access operations of the "n" access operations), the accumulated error information of the first row of the DRAM device 120 may be "k". That is, the accumulated error information may be a value obtained by accumulating the number of error bits detected during a plurality of access operations associated with each of the plurality of rows.

The repair manager 111b may determine a fail row at the DRAM device 120 based on the accumulated error information. For example, in the case where the accumulated error information exceeds a reference value, the repair manager 111b may determine that a corresponding row is a fail row. For example, in the case where the accumulated error information about the first row of the DRAM device 120 is "k" and "k" is greater than a preset reference value, the repair manager 111b may determine that the first row is a fail row.

In an exemplary embodiment, the first row which is determined as a fail row by the repair manager 111b may not be an actual fail row (i.e., an actual failed row). That is, at a current time, while an access operation associated with the first row which is determined as a fail row by the repair manager 111b may be performed normally (e.g., an error bit included in the first row is corrected normally), the first row may become an actual fail row due to additional access operations or over time. The actual fail row may indicate a row where stored data are lost due to a fault of memory cells (e.g., reduction of refresh performance of a memory cell or reduction of retention characteristic of a memory cell). An error of data read from the actual fail row may not be corrected by the DRAM ECC unit 111a.

That is, a "fail row" used in this disclosure, in particular a fail row as determined by the repair manager 111b, may indicate a row having high probability to switch into an actual fail row over time or due to an additional access operation. However, the inventive concepts are not so limited, and a fail row determined by the repair manager 111b may indicate an actual fail row.

In an exemplary embodiment, the reference value may vary with a physical characteristic or an operation environment of the DRAM device 120 or performance of the DRAM ECC unit 111a. For example, in the case where the physical characteristic or the operation environment of the DRAM device 120 is good (in other words, in the case where the process, voltage, and temperature (PVT) variation is relatively small or in the case where the performance of the DRAM ECC unit 111a is relatively high), the reference value may be set to a first value; in the case where the physical characteristic or the operation environment of the DRAM device 120 is not good (in other words, in the case where the PVT variation is relatively great or in the case where the performance of the DRAM ECC unit 111a is relatively low), the reference value may be set to a second value smaller than the first value.

In the case where the fail row is detected, the repair manager 111b may perform the runtime repair operation on the DRAM device 120. In an embodiment, the repair manager 111b may perform the runtime repair operation based on various schemes. Runtime repair operations according to embodiments of the inventive concepts will be more fully described subsequently with reference to the following drawings.

The SRAM 113 may be used as a buffer memory, a cache memory, or a working memory of the storage controller 110. In an exemplary embodiment, various information or software components stored in the SRAM 113 may be managed or driven by the processor 112.

The nonvolatile memory ECC unit 114 may perform an error detection and correction operation on data read from the nonvolatile memory device 130. For example, the nonvolatile memory ECC unit 114 may generate an error correction code for first data received from the host 11. The generated error correction code may be stored to the nonvolatile memory device 130 together with the first data. Afterwards, the nonvolatile memory ECC unit 114 may read the first data and the error correction code from the nonvolatile memory device 130 and may detect and correct an error of the first data based on the read error correction code.

In an exemplary embodiment, the nonvolatile memory ECC unit 114 and the DRAM ECC unit 111a may be implemented with different functional blocks. Alternatively, the nonvolatile memory ECC unit 114 and the DRAM ECC unit 111a may be implemented with the same functional block.

The storage controller 110 may communicate with the host 11 through the host interface 115. In an exemplary embodiment, the host interface 115 may include at least one of various interfaces such as for example a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI®), a nonvolatile memory-express (NVM-e) interface, and universal flash storage (UFS), or the like.

The storage controller 110 may communicate with the nonvolatile memory device 130 through the flash interface 116. In an exemplary embodiment, the flash interface 116 may include for example a NAND interface.

Figure 3:
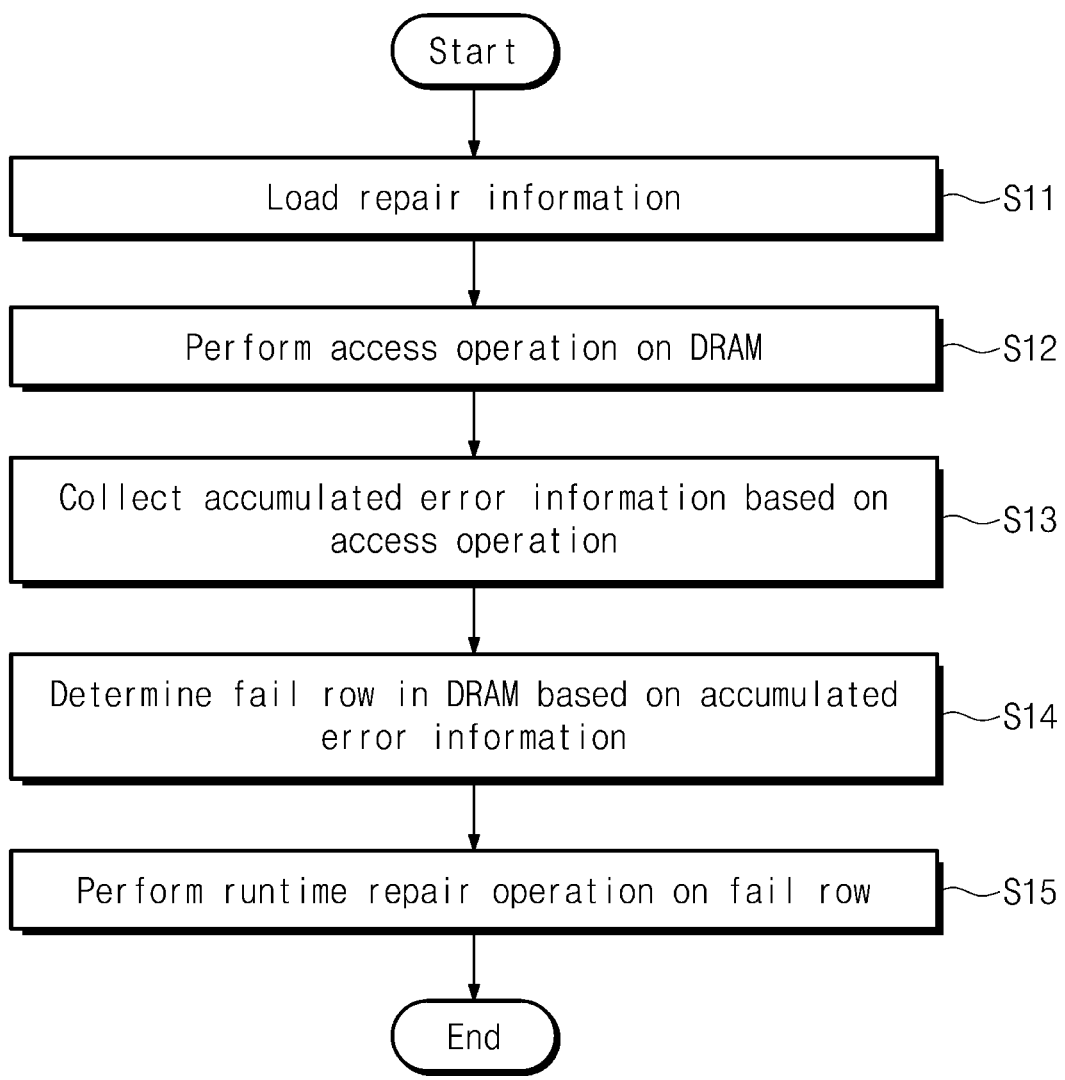
FIG. 3 is illustrates flowchart of an operation of a storage controller of FIG. 2.

FIG. 3 illustrates a flowchart of an operation of a storage controller of FIG. 2. Referring to FIGS. 2 and 3, in operation S11, the storage controller 110 loads repair information. The repair information may include information necessary to perform a fail row detection operation or a runtime repair operation. For example, the repair information may include accumulated error information about each of a plurality of rows in the DRAM device 120. The repair information may be stored to a particular area (e.g., a meta area) of the nonvolatile memory device 130. The storage controller 110 may load the repair information stored in the particular area of the nonvolatile memory device 130. In an exemplary embodiment, the repair information may be stored to the SRAM 113, and may be managed by the processor 112 or the DRAM control unit 111.

In operation S12, the storage controller 110 performs an access operation on the DRAM device 120. For example, the storage controller 110 may write various information or data to the DRAM device 120. Alternatively, the storage controller 110 may read information or data stored in the DRAM device 120 and may perform an error detection and correction operation on the read data.

In operation S13, the storage controller 110 collects the accumulated error information based on the access operation. For example, the storage controller 110 may manage the accumulated error information about each of the plurality of rows in the DRAM device 120 based on a result of the above-described error detection operation. As described above, the accumulated error information may indicate the number of error bits accumulated with respect to each row of the DRAM device 120.

In operation S14, the storage controller 110 determines a fail row at the DRAM device 120 based on the accumulated error information. For example, the storage controller 110 may determine that a row, which has accumulated error information that exceeds the reference value, from among the plurality of rows of the DRAM device 120 is a fail row.

In operation S15, the storage controller 110 performs the runtime repair operation on the determined fail row. For example, the storage controller 110 may perform a direct repair operation on the fail row. The direct repair operation indicates an operation of directly restoring or repairing a fail row through electrical fuse-setting within the DRAM device 120.

Alternatively, the storage controller 110 may perform an indirect repair operation on the fail row. The indirect repair operation indicates an operation of indirectly restoring or repairing a fail row at a storage controller layer by remapping the fail row onto a reserved row of a reserved area, on the DRAM control unit 111. Alternatively, the storage controller 110 may perform the direct repair operation under a particular condition after performing the indirect repair operation on the fail row. The direct repair operation and the indirect repair operation according to embodiments of the inventive concepts will be more fully described subsequently with reference to the following drawings.

As described above, in the case where a fail row is detected in the DRAM device 120 while the storage device 100 including the DRAM device 120 is being driven, the storage device 100 may perform the runtime repair operation on the fail row. As such, since a fail row detected in the DRAM device 120 while the storage device 100 is being driven is restored in advance, the reliability and lifespan of the DRAM device 120, or the storage device 100 including the DRAM device 120, are improved.

FIG. 4 illustrates a diagram descriptive of operation S13 and operation S14 of FIG. 3. Operation S13 and operation S14 of FIG. 3 constitute an operation of collecting the accumulated error information. For brevity of illustration and for convenience of description, components which are unnecessary to describe operation S13 and operation S14 of FIG. 3 are omitted. Also, it is assumed that the DRAM device 120 includes first to fourth rows ROW1 to ROW4. However, the inventive concepts are not so limited and the DRAM device 120 may include any number of rows greater than 4.

Referring to FIGS. 2 to 4, the DRAM control unit 111 may perform an access operation on the first row ROW1 of the DRAM device 120. For example, the DRAM control unit 111 may read first data DATA1 from the first row ROW1 of the DRAM device 120. The DRAM ECC unit 111a may perform an error detection and correction operation on the first data DATA1, and the error-corrected first data DATA1' may be provided to the host 11 or the nonvolatile memory device 130.

Error detection information "E" about the error detected by the DRAM ECC unit 111a may be provided to the repair manager 111b. In an embodiment, the error detection information "E" may indicate the number of detected error bits.

The repair manager 111b may update accumulated error information AEI based on the error detection information "E". For example, the repair manager 111b may manage the accumulated error information AEI. The accumulated error information AEI may include information about the number of error bits accumulated (i.e., the accumulated count of error bits) with respect to each of the rows ROW1 to ROW4 of the DRAM device 120. For example, the number of error bits accumulated with respect to the first row ROW1 may be "a", the number of error bits accumulated with respect to the second row ROW2 may be "b", the number of error bits accumulated with respect to the third row ROW3 may be "c", and the number of error bits accumulated with respect to the fourth row ROW4 may be "d".

The repair manager 111b may update a value of a relevant row based on the error detection information "E" received from the DRAM ECC unit 111a. For example, in the case where the received error detection information "E" indicates information about the number of error bits associated with the first data DATA1 from the first row ROW1, the repair manager 111b may update a value corresponding to the first row ROW1 among the accumulated error information AEI from "a" to "a+E". That is, the repair manager 111b may accumulate the information "E" about the detected error at the value corresponding to the first row ROW1 among the accumulated error information AEI. The DRAM control unit 111 may manage the accumulated error information AEI about each row of the DRAM device 120 by repeatedly performing the above-described operation.

In an embodiment, in the case where a value (i.e., a+E) updated with respect to the first row ROW1 is greater than a reference value REF, the repair manager 111b may determine that the first row ROW1 is a fail row.

FIG. 5 illustrates a flowchart of operation S15 of FIG. 3. As an embodiment, the direct repair operation (or a hard repair operation) of the runtime repair operations according to the inventive concepts will be described with reference to FIG. 5. In an exemplary embodiment, an operation according to the flowchart of FIG. 5 may be performed after a fail row is detected through operation S14 of FIG. 3.

Referring to FIGS. 2, 3, and 5, in operation S110, the storage controller 110 determines whether the storage device 100 is idle. For example, an idle state of the storage device 100 may indicate a state in which a command or a request is not received from the host 11. In an exemplary embodiment, in the case where the storage device 100 is not idle (No in S110), operation will loop back to operation S110 while the storage device 100 may perform a normal operation in response to the request of the host 11.

In the case where the storage device 100 is idle (Yes in S110), in operation S111 the storage controller 110 blocks an access to the DRAM device 120. For example, the DRAM device 120 may include a plurality of banks. The storage controller 110 may block or stop an access to all banks of the DRAM device 120.

In operation S112, the storage controller 110 flushes data stored in the DRAM device 120 to the nonvolatile memory device 130. For example, while the storage controller 110 performs the direct repair operation on the DRAM device 120, a refresh operation of the DRAM device 120 can not be performed. For this reason, data stored in the DRAM device 120 may be lost. To prevent data stored in the DRAM device 120 from being lost, the storage controller 110 may flush data stored in the DRAM device 120 to the nonvolatile memory device 130.

In an exemplary embodiment, the storage controller 110 may flush data stored in all banks of the DRAM device 120 to the nonvolatile memory device 130. Alternatively, the storage controller 110 may flush data stored in some banks of the banks of the DRAM device 120 to the nonvolatile memory device 130. In an exemplary embodiment, some banks may include at least two or more banks including a fail row. That is, the storage controller 110 may flush some of the data (i.e., partial data) from among the data stored in the DRAM device 120, or may flush all of the data (i.e., whole data) in the DRAM device 120.

In operation S113, the storage controller 110 performs the direct repair operation. For example, the storage controller 110 may perform an operation of restoring a fail row through electrical fuse-setting, at the DRAM device 120. In an exemplary embodiment, the direct repair operation may be performed based on a post-package repair (PPR) operation.

In operation S114, the storage controller 110 restores the data flushed to the nonvolatile memory device 130 to the DRAM device 120. Afterwards, the storage device 100 may operate normally.

Figure 6A:
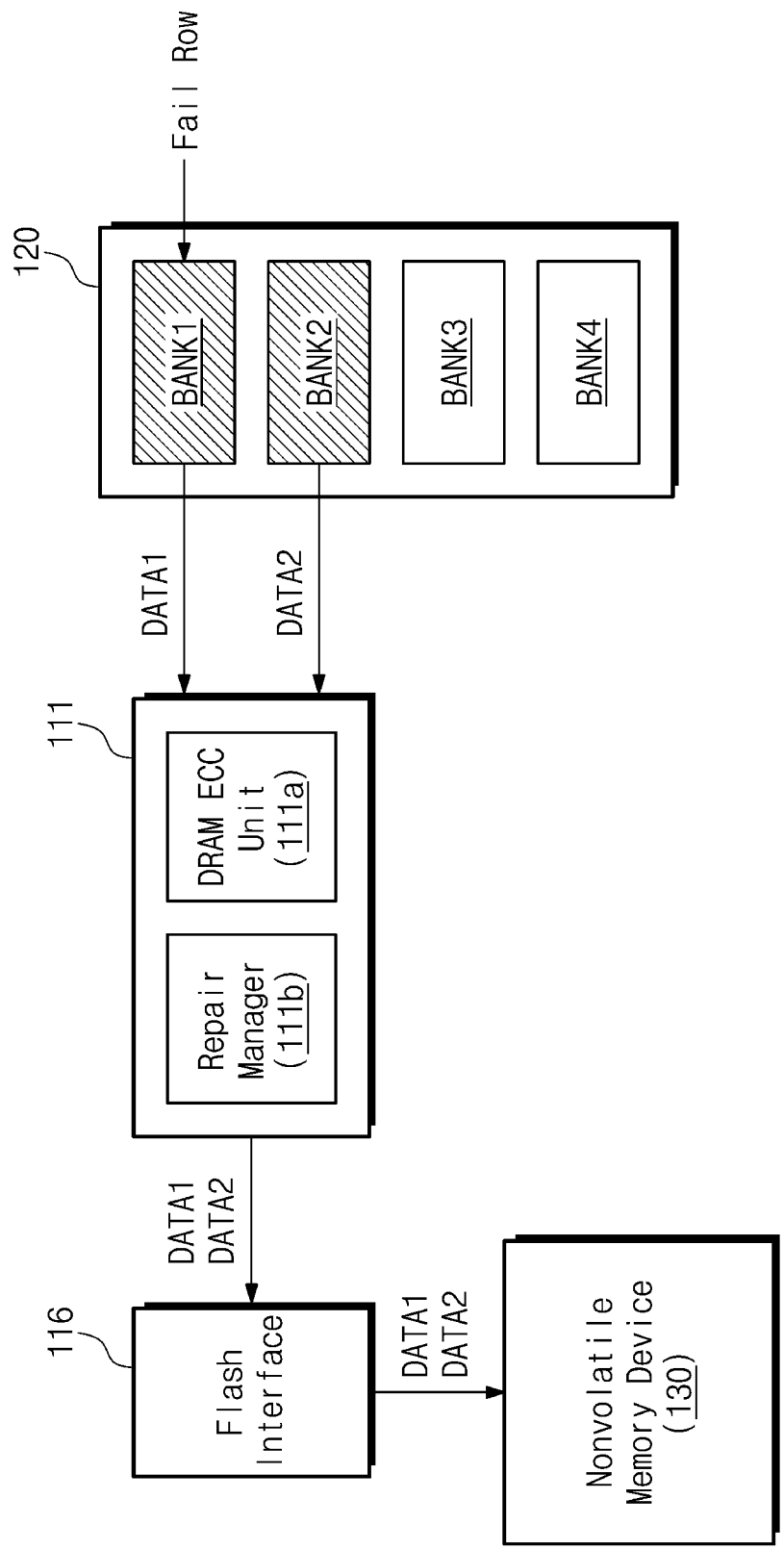
FIG. 6A illustrates a diagram descriptive of operation S112 of FIG. 5.
Figure 6B:
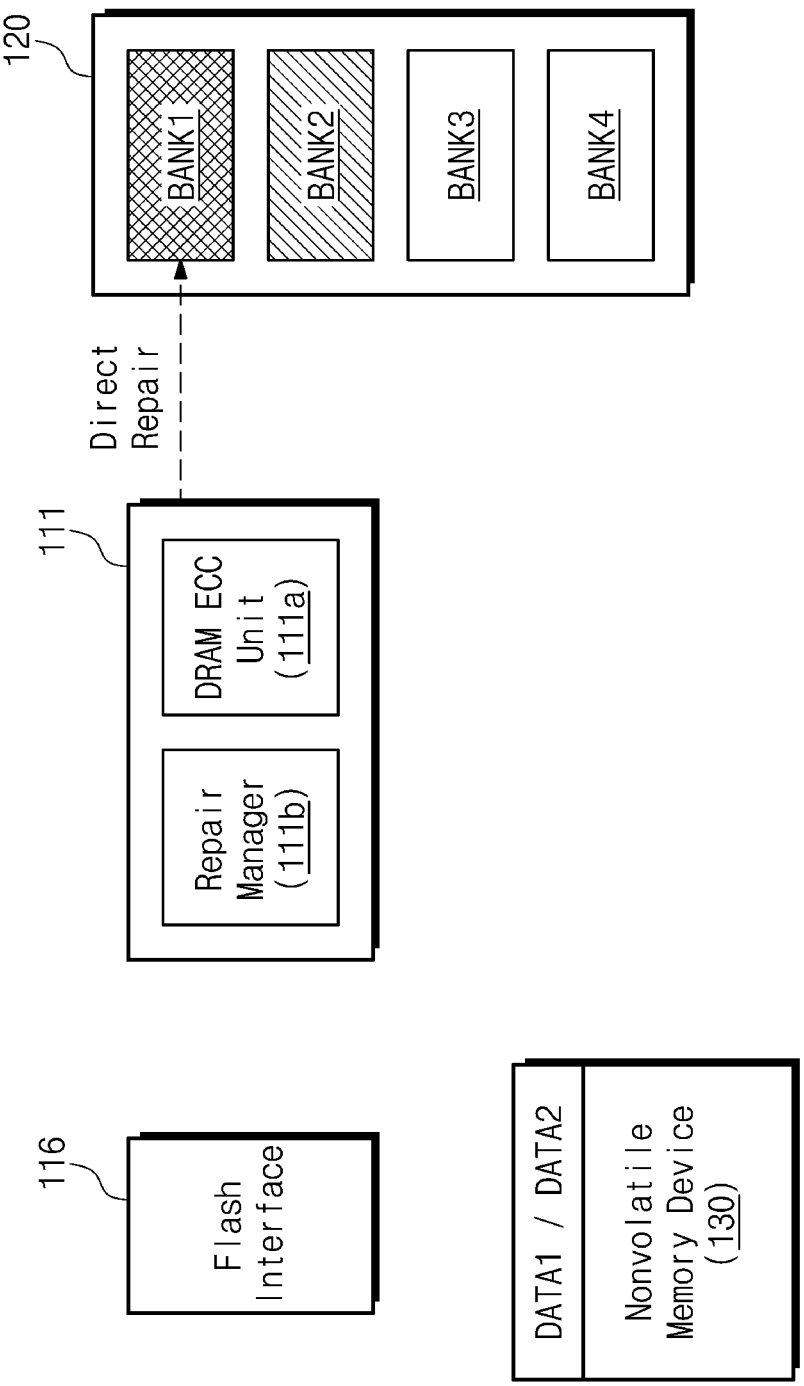
FIG. 6B illustrates a diagram descriptive of operation S113 of FIG. 5.
Figure 6C:
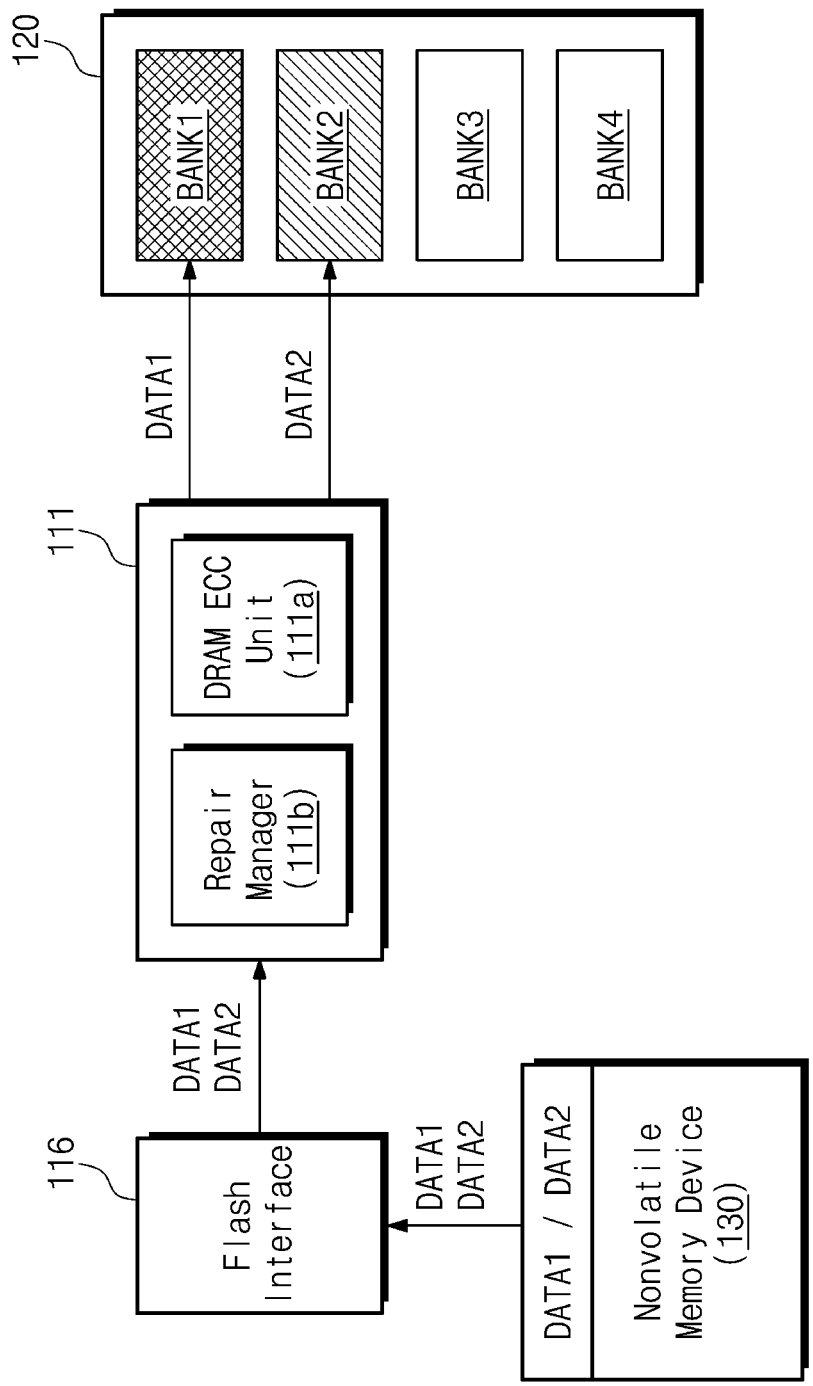
FIG. 6C illustrates a diagram descriptive of operation S114 of FIG. 5.

FIGS. 6A, 6B and 6C illustrate diagrams respectively descriptive of operation S112, operation S113 and operation S114 of FIG. 5. For brevity of illustration and for convenience of description, components which are unnecessary to describe operation S112 to operation S114 of FIG. 5 are omitted. For convenience of description, it is assumed that the DRAM device 120 includes first to fourth banks BANK1 to BANK4 and a fail row is included in the first bank BANK1. However, the inventive concepts are not so limited and the DRAM device 120 may include any number of banks.

Referring to FIGS. 2, 5 and 6A to 6C, in operation S112 the storage controller 110 may transfer, to the nonvolatile memory device 130, data DATA1 stored in the first bank BANK1, in which a fail row is included, from among the banks BANK1 to BANK4 of the DRAM device 120, and also data DATA2 stored in the second bank BANK2 adjacent to the first bank BANK1. For example, the DRAM control unit 111 may read the first and second data DATA1 and DATA2 from the first and second banks BANK1 and BANK2. In an exemplary embodiment, the DRAM ECC unit 111a may correct an error of the first and second data DATA1 and DATA2 read from the first and second banks BANK1 and BANK2. Afterwards, the first and second data DATA1 and DATA2 (or error-corrected first and second data) may be provided to the nonvolatile memory device 130 through the flash interface 116. The nonvolatile memory device 130 may store first and second data DATA1 and DATA2.

Next, as illustrated in FIG. 6B, in operation S113 the DRAM control unit 111 may perform the direct repair operation on the first bank BANK1 in which the fail row is included. For example, the DRAM device 120 may repair the fail row through an operation such as electrical fuse-setting, in response to various signals from the DRAM control unit 111.

Afterwards, as illustrated in FIG. 6C, in operation S114 the storage controller 110 may store the first and second data DATA1 and DATA2 stored in the nonvolatile memory device 130 to the first and second banks BANK1 and BANK2. For example, the DRAM control unit 111 may receive the first and second data DATA1 and DATA2 from the nonvolatile memory device 130 through the flash interface 116 and may store the received first and second data DATA1 and DATA2 to the first and second banks BANK1 and BANK2, respectively.

Figure 7:
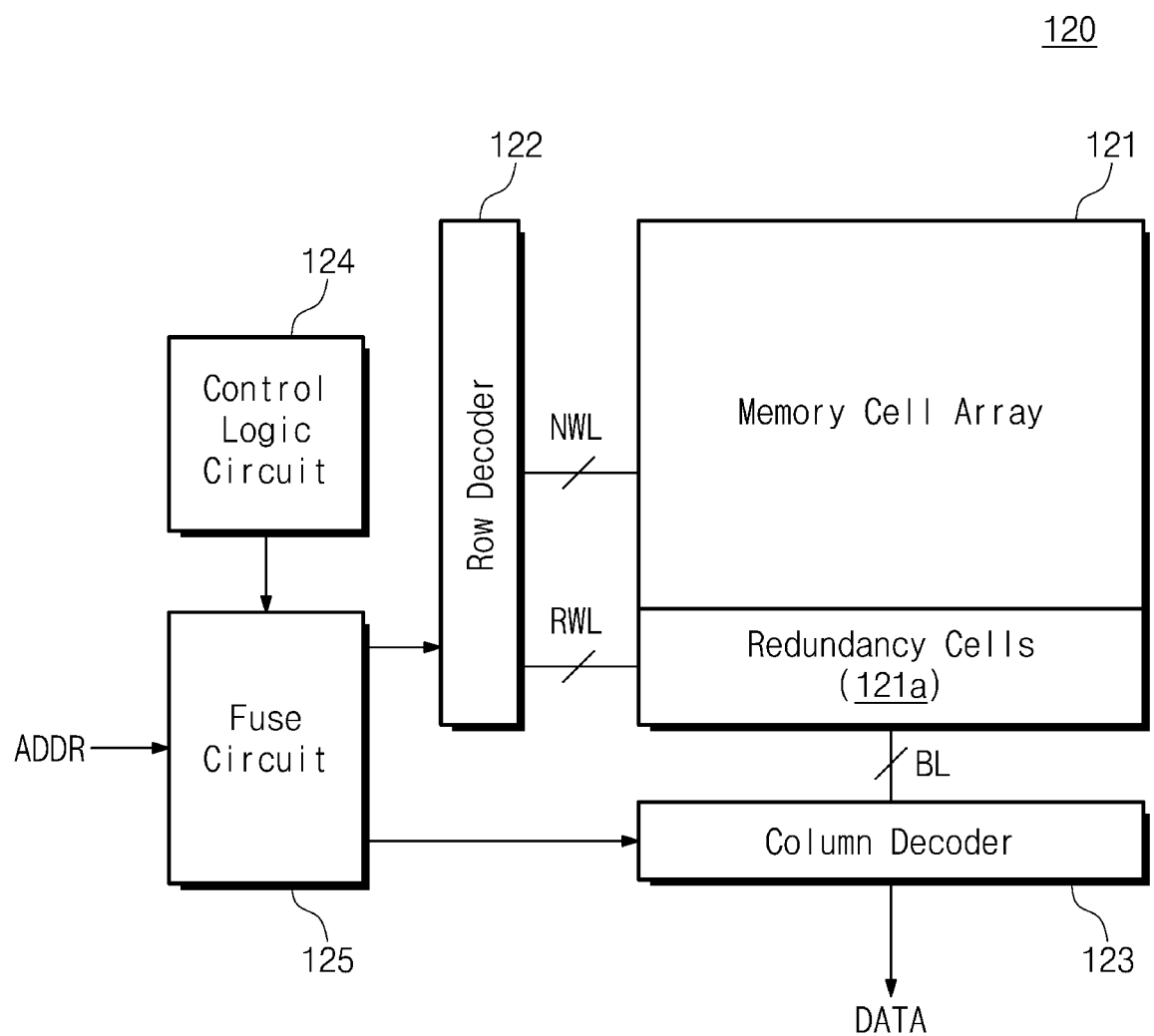
FIG. 7 illustrates a block diagram of a DRAM device performing operation S113 of FIG. 5.

FIG. 7 illustrates a block diagram of a DRAM device performing operation S113 (i.e., a direct repair operation) of FIG. 5. For brevity of illustration and for convenience of description, components which are unnecessary to describe operation S113 of FIG. 5 are omitted.

Referring to FIGS. 2 and 7, the DRAM device 120 includes a memory cell array 121, a row decoder 122, a column decoder 123, a control logic circuit 124, and a fuse circuit 125.

The memory cell array 121 may include a plurality of DRAM cells. The plurality of DRAM cells may be connected with word lines and bit lines. A part of the plurality of DRAM cells may be normal cells, and the remaining DRAM cells may be redundancy cells 121a. The redundancy cells 121a may be DRAM cells for replacing fail cells among the normal cells. The normal cells may be characterized as user cells that are accessible to the host (i.e., a user)

The row decoder 122 may be connected with the memory cell array 121 through word lines NWL and RWL. The row decoder 122 may select one of the word lines NWL and RWL based on an address ADDR and may control a voltage of the selected word line.

The column decoder 123 may be connected with the memory cell array 131 through bit lines BL. The column decoder 123 may select a part of the bit lines BL based on the address ADDR and may control or sense voltages of the selected bit lines. In an exemplary embodiment, the column decoder 123 may exchange data DATA with the DRAM control unit 111.

The control logic circuit 124 may control an operation of the DRAM device 120. The fuse circuit 125 may perform a fuse setting operation under control of the control logic circuit 124. That is, the control logic circuit 124 may be configured to again make (e.g., perform) fuse-setting of the fuse circuit 125, by the runtime repair operation (e.g., the direct repair operation) of the storage controller 110. A fail cell(s) among the normal cells of the memory cell array 121 may be replaced with a relevant cell(s) of the redundancy cells 121a through the fuse setting of the fuse circuit 125. For example, the fuse circuit 125 may receive the address ADDR from the DRAM control unit 111. The address ADDR may be an address (i.e., a fail address) associated with a normal word line NWL corresponding to a fail row. In this case, the fuse circuit 125 may output a repair address to allow the row decoder 122 to select a redundancy word line RWL instead of a normal word line NWL.

That is, fuse-setting may be made on the fuse circuit 125 to convert and output a fail address corresponding to a fail row into a repair address. The row decoder 122 may select the redundancy word line RWL based on the repair address from the fuse circuit 125. In an exemplary embodiment, the fuse circuit 125 may transfer a received address ADDR, which does not correspond to a fail row, to the row decoder 122 without separate conversion.

As described above, the DRAM device 120 may perform a restoration operation on a fail row by making electrical fuse-setting of the fuse circuit 135.

Figure 8:
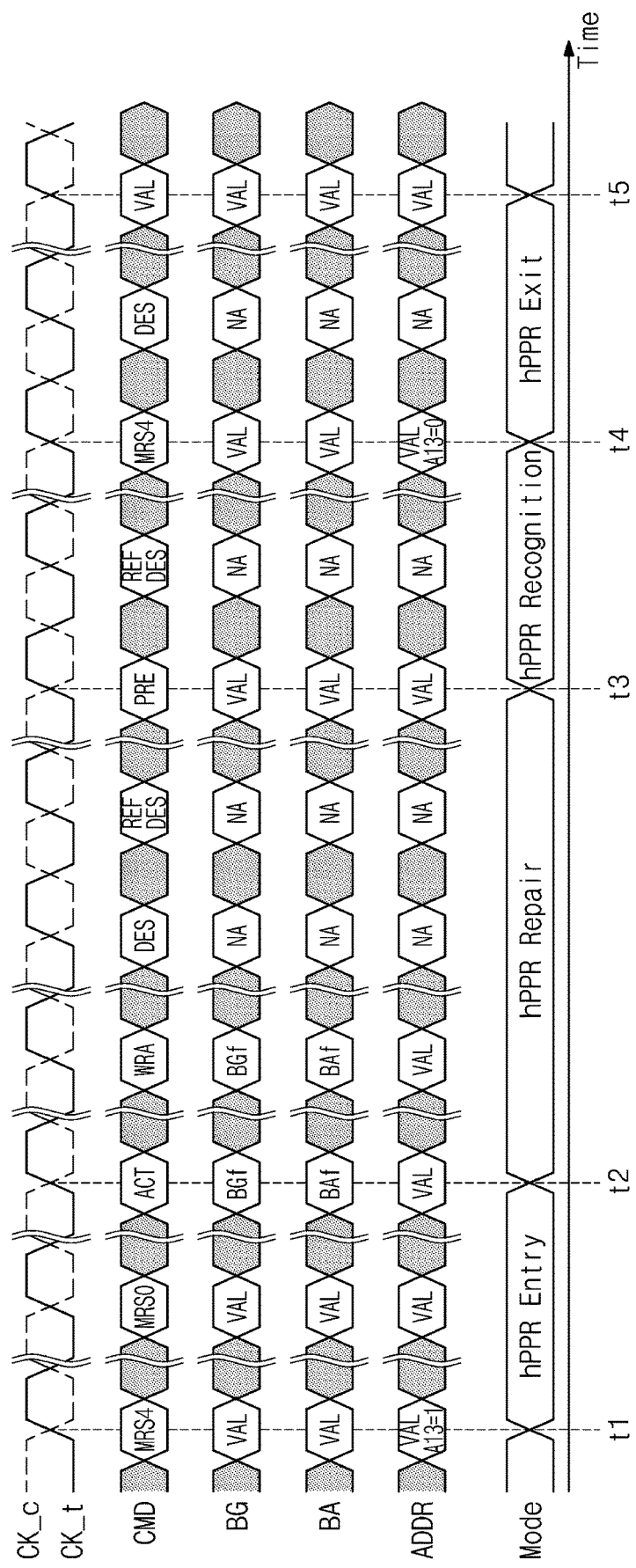
FIG. 8 illustrates a timing diagram of input/output signals associated with a direct repair operation of FIG. 6B.

FIG. 8 illustrates a timing diagram of input/output signals associated with a direct repair operation of FIG. 6B. In an exemplary embodiment, the DRAM device 120 may perform the direct repair operation based on hard post package repair hPPR. In an exemplary embodiment, electrical fuse-setting of the fuse circuit 125 described with reference to FIG. 7 may be performed in response to signals of the timing diagram of FIG. 8.

Referring to FIGS. 2 and 8, from a first time t1 to a second time t2 (i.e., hPPR Entry), the DRAM device 120 may enter a hard post package repair mode hPPR in response to mode register set commands MRS4 and MRS0 and address signals BG, BA, and ADDR from the storage controller 110. In an exemplary embodiment, at the first time t1, a value of a thirteenth address A13 may be set to "1" indicating activation of a hard post package repair operation. In an exemplary embodiment, before entering the hard post package repair mode hPPR, data stored in a bank in which a fail row is included or data stored in a bank adjacent to the bank in the fail row is included may be flushed to the nonvolatile memory device 130. Also, before entering the hard post package repair mode hPPR, all banks of the DRAM device 120 may be precharged.

Afterwards, from the second time t2 to a third time t3 (i.e., hPPR Repair), the DRAM device 120 may perform an hPPR repair operation in response to an activate command ACT, an auto precharge write command WRA, and address signals BGf and BAf. In an exemplary embodiment, the address signals BGf, BAf, and ADDR may be address signals corresponding to a fail row. The hPPR repair operation may be performed through electrical fuse-setting of the fuse circuit 135 as described with reference to FIG. 7.

Afterwards, from the third time t3 to a fourth time t4 (i.e., hPPR Recognition), the DRAM device 120 may perform hPPR recognition in response to a precharge command PRE. From the fourth time t4 to a fifth time t5 (i.e., hPPRExit), the DRAM device 120 may exit from the hPPR mode in response to a mode register set command MRS4 and an address signal (in particular, A13=0). Afterwards, the DRAM device 120 may restore the flushed data under control of the DRAM control unit 111.

In an exemplary embodiment, the timing diagram of FIG. 8 is associated with an exemplary embodiment of the direct repair operation, and the inventive concepts are not so limited. For example, the above-described hPPR operation may be performed by using a normal write command WR instead of the auto precharge write command WRA. In this case, before entering the hPPPR mode, data stored in all banks of the DRAM device 120 may be backed up (i.e., flushed). Alternatively, the direct repair operation may be performed based on soft post package repair sPPR.

Figure 9:
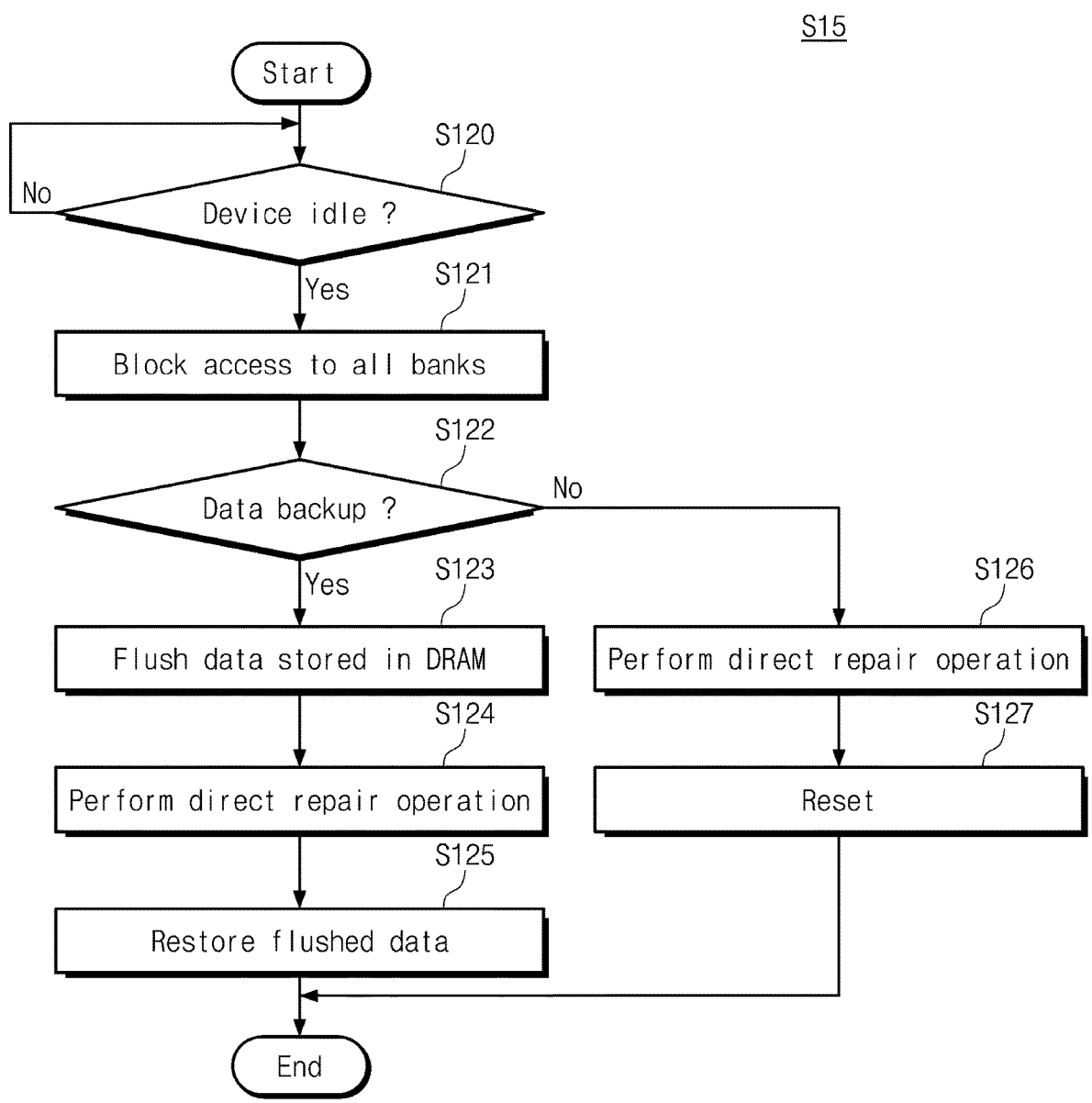
FIG. 9 illustrates a flowchart of operation S15 of FIG. 3.

FIG. 9 illustrates a flowchart of operation S15 of FIG. 3. Referring to FIGS. 2, 3, and 9, the storage controller 110 performs operation S120 and operation S121. Operation S120 and operation S121 may be identical to operation S110 and operation S111 of FIG. 5, and thus, detailed description thereof will not be repeated here.

In operation S122, the storage controller 110 determines whether a backup operation for data stored in the DRAM device 120 is required. For example, in the case where important data (e.g., mapping information and meta information) are stored in banks, in which a fail row is included, from among a plurality of banks of the DRAM device 120, the storage controller 110 may determine that the backup operation is required (Yes in S122). In this case, the storage device 100 performs operation S123 to operation S125. Operation S123 to operation S125 may be similar to operation S112 to operation S114 of FIG. 5, and thus, detailed description thereof will not be repeated here.

In the case where important data are not stored in banks, in which a fail row is included, from among a plurality of banks (e.g., only simply buffered user data are stored in the banks in which the fail row is included), the storage controller 110 may determine that the backup operation is not required (No in S122). In this case, in operation S126 the storage controller 110 performs the direct repair operation without a separate backup operation. For example, in the case where only simple user data which have been already stored in the nonvolatile memory device 130 are stored in banks on which the direct repair operation will be performed, even though data of the DRAM device 120 are lost during the direct repair operation, the lost data (i.e., simple user data) may be restored from the nonvolatile memory device 130. That is, even though the storage controller 110 performs the direct repair operation without a separate backup operation, the storage device 100 may operate normally. After the direct repair operation is completed, in operation S127, the storage controller 110 or the storage device 100 is reset.

As described above, in the case where important data are not stored in banks on which the direct repair operation will be performed, the direct repair operation may be performed without a separate backup operation.

Figure 10:
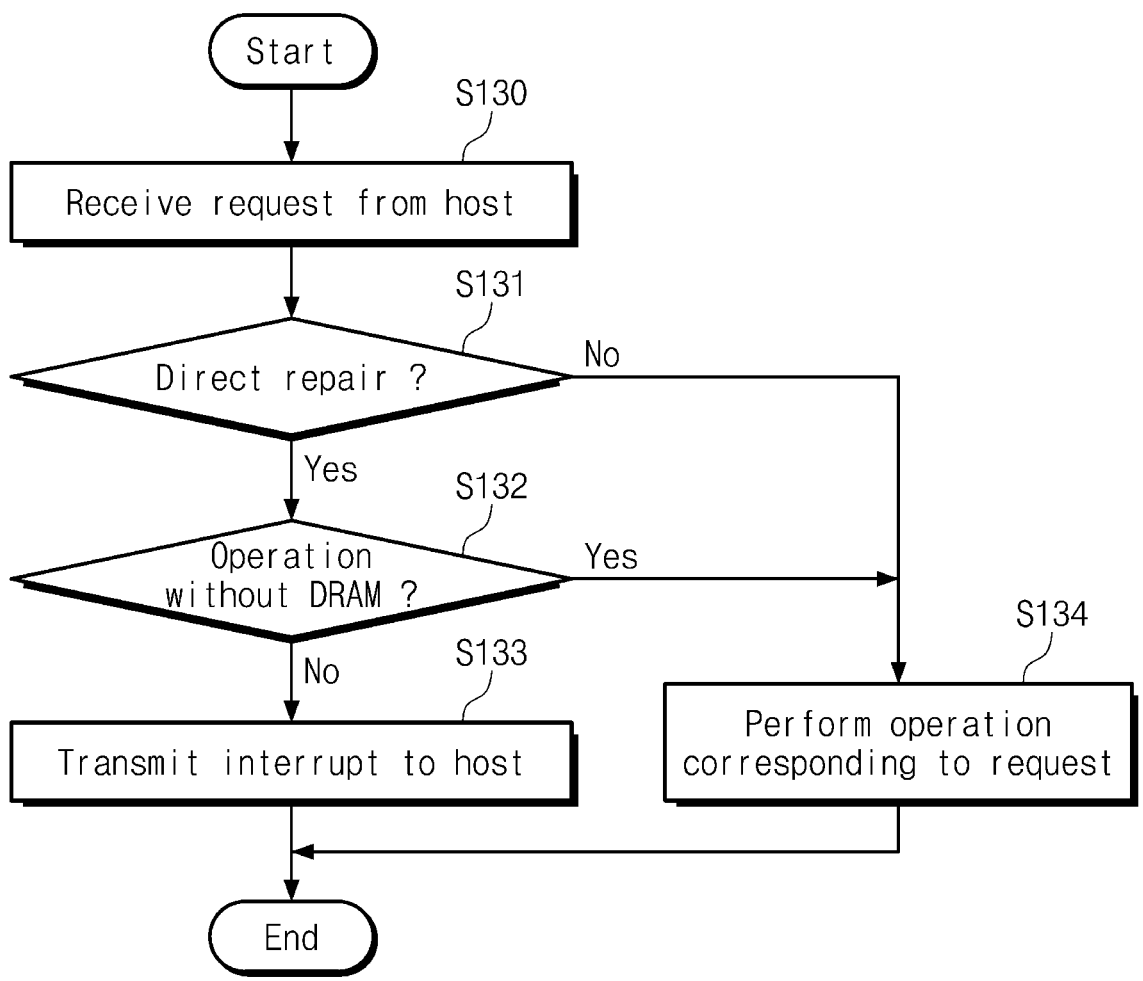
FIG. 10 illustrates a flowchart of an operation of a storage controller of FIG. 2.

FIG. 10 illustrates a flowchart of an operation of a storage controller of FIG. 2. A method in which the storage controller 110 processes a request of the host 11 while performing the direct repair operation will be described with reference to FIG. 10.

Referring to FIGS. 2 and 10, in operation S130, the storage controller 110 receives a request from the host 11. For example, the host 11 may transmit a request to the storage device 100 for the purpose of performing various operations (e.g., a read operation, a write operation, and an erase operation).

In operation S131, the storage controller 110 determines whether the direct repair operation is being performed. For example, the storage controller 110 may receive a request from the host 11 while performing the direct repair operation described with reference to FIGS. 1 to 9.

In the case where the direct repair operation is being performed (Yes in S131), in operation S132 the storage controller 110 determines whether the received request is associated with an operation not requiring the DRAM device 120.

In the case where the received request accompanies an operation of the DRAM device 120 (No in S132), in operation S133 the storage controller 110 provides an interrupt signal to the host 11. For example, as described above, in the case where the direct repair operation is being performed, all accesses to the DRAM device 120 may be blocked or stopped. That is, in the case where the request from the host 11 accompanies an operation (e.g., a read operation or a write operation) of using the DRAM device 120, the storage controller 110 may fail to process the request from the host 11 immediately or within a given time. In this case, the storage controller 110 provides an interrupt signal to the host 11, and the host 11 recognizes that the storage controller 110 is performing the runtime repair operation (or the direct repair operation) in response to the interrupt signal.

In the case where the storage controller 110 determines that a direct repair operation is not being performed (No in S131), in operation S134 the storage controller 110 performs an operation corresponding to the received request. Alternatively, even though the direct repair operation is being performed, in the case where the received request is associated with an operation (e.g., a physical erase operation of the nonvolatile memory device 130) which is possible without the DRAM device 120, the storage controller 110 performs operation S134. Also, in the case where the received request does not include an operation of the DRAM device 120 (Yes in S132), in operation S134 the storage controller 110 performs an operation corresponding to the received request.

Figure 11:
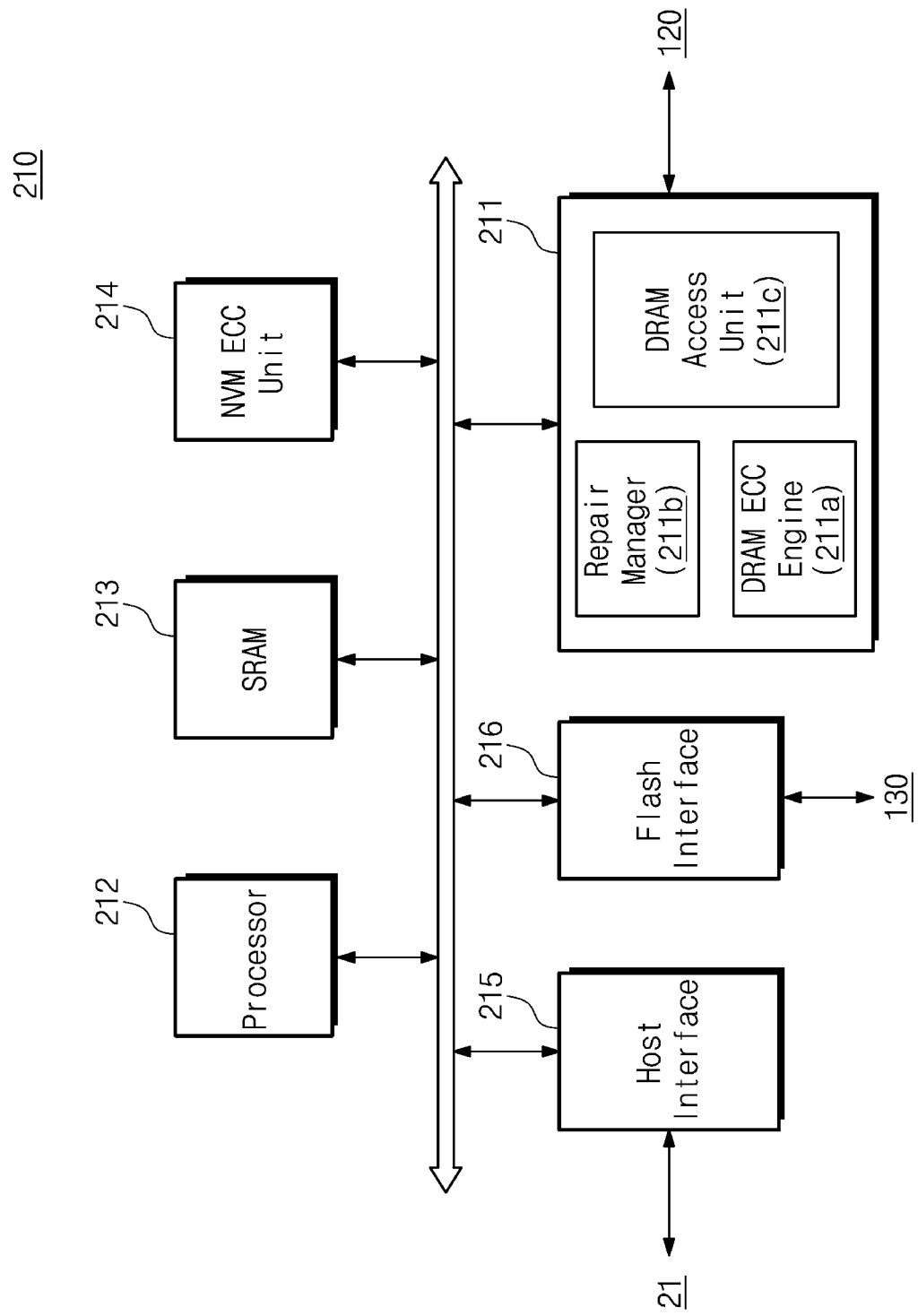
FIG. 11 illustrates a block diagram of a storage controller according to another embodiment of the inventive concepts.

FIG. 11 illustrates a block diagram of a storage controller according to another embodiment of the inventive concepts. Referring to FIG. 11, storage controller 210 includes a DRAM control unit 211, a processor 212, an SRAM 213, an NVM ECC unit 214, a host interface 215, and a flash interface 216. The processor 212, the SRAM 213, the NVM ECC unit 214, the host interface 215, and the flash interface 216 are respectively configured and operate similarly as processor 112, the SRAM 113, the NVM ECC unit 114, the host interface 115, and the flash interface 116 as previously described with reference to FIG. 2, and thus additional description will be omitted to avoid redundancy. The DRAM control unit 211 in this embodiment is connected to a DRAM device such as DRAM device 120 shown in FIG. 1, and hereinafter will be described with reference to DRAM device 120. Similarly, the flash interface 216 in this embodiment is connected to a nonvolatile memory device such as nonvolatile memory device 130 in FIG. 1, and hereinafter will be described with reference to nonvolatile memory device 130.

The DRAM control unit 211 includes a DRAM ECC unit 211a, a repair manager 211b, and a DRAM access manager 211c. The DRAM ECC unit 211a and the repair manager 211b are respectively configured and operate similarly as the DRAM ECC unit 111a and the repair manager 111b described above with reference to FIG. 2, and thus a detailed description thereof will not be repeated here.

The DRAM access manager 211c may manage an address for an access to a DRAM device 120 (e.g., see FIG. 1). The DRAM access manager 211c may be implemented with a cache layer structure. For example, in the case where the processor 212 generates a first address for the purpose of accessing the DRAM device 120, the DRAM access manager 211c may determine whether a row corresponding to the first address is a fail row and may output a reserved address instead of the first address when the row corresponding to the first address is a fail row. An access to the DRAM device 120 may be performed based on the reserved address output by the DRAM access manager 211c.

In an exemplary embodiment, the DRAM access manager 211c may include various information for the above-described fail row determination operation and an address remapping operation. For example, the DRAM access manager 211c may include address field information which includes an address and a remap flag associated with each of a plurality of rows of the DRAM device 120. The DRAM access manager 211c may include a remap table which includes remap information between an address of a fail row and a reserved address of a reserved area.

In an exemplary embodiment, various information (i.e., the address field information and the remap table) managed by the DRAM access manager 211c may be stored to the SRAM 213, and may be updated by an indirect repair operation (or a soft repair operation) of the repair manager 211b. The indirect repair operation will be more fully described with reference to the following drawings.

Figure 12:
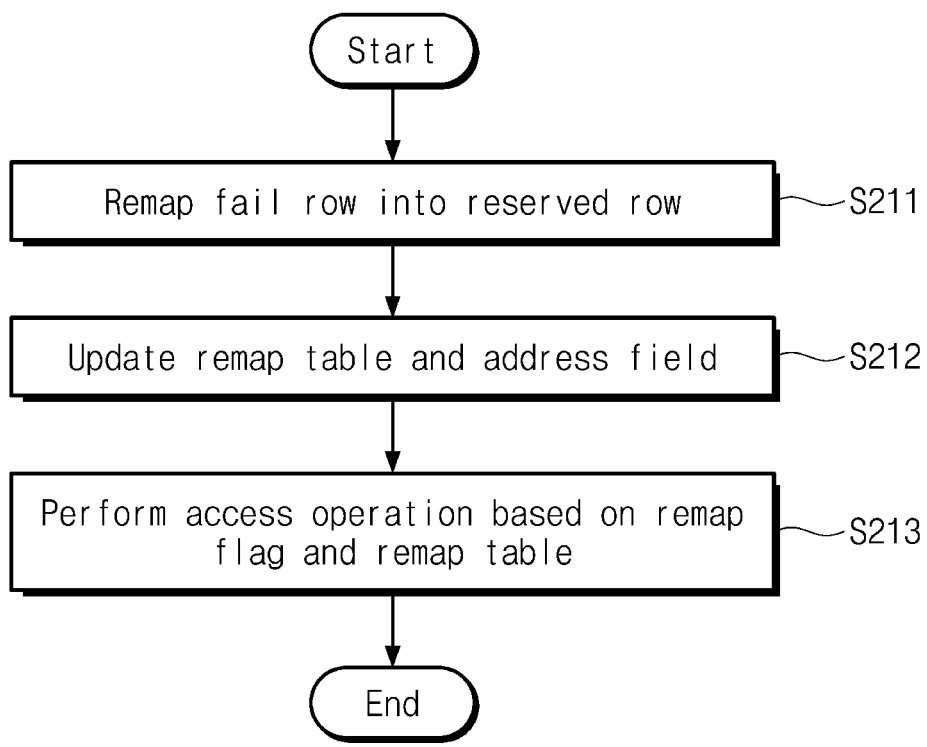
FIG. 12 illustrates a flowchart of an indirect repair operation of a storage controller of FIG. 11.
Figure 13A:
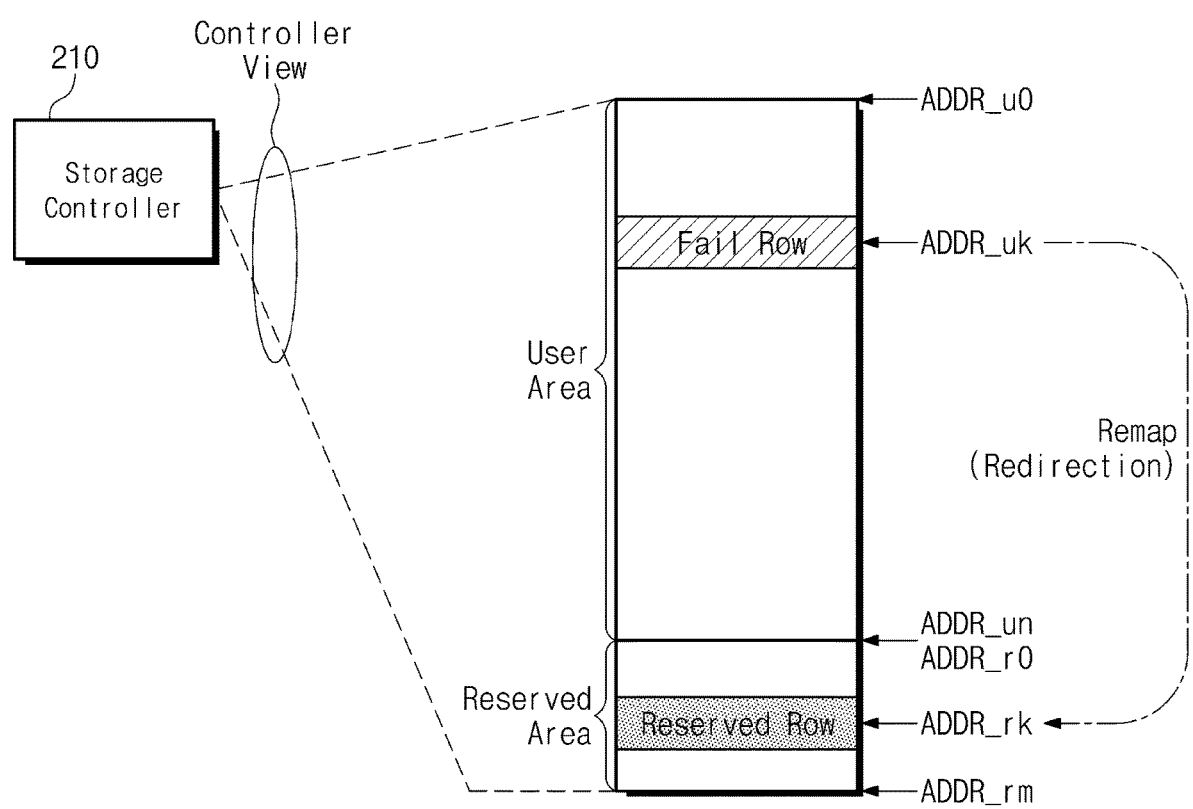
FIG. 13A illustrates a diagram descriptive of an operation according to the flowchart of FIG. 12.
Figure 13B:
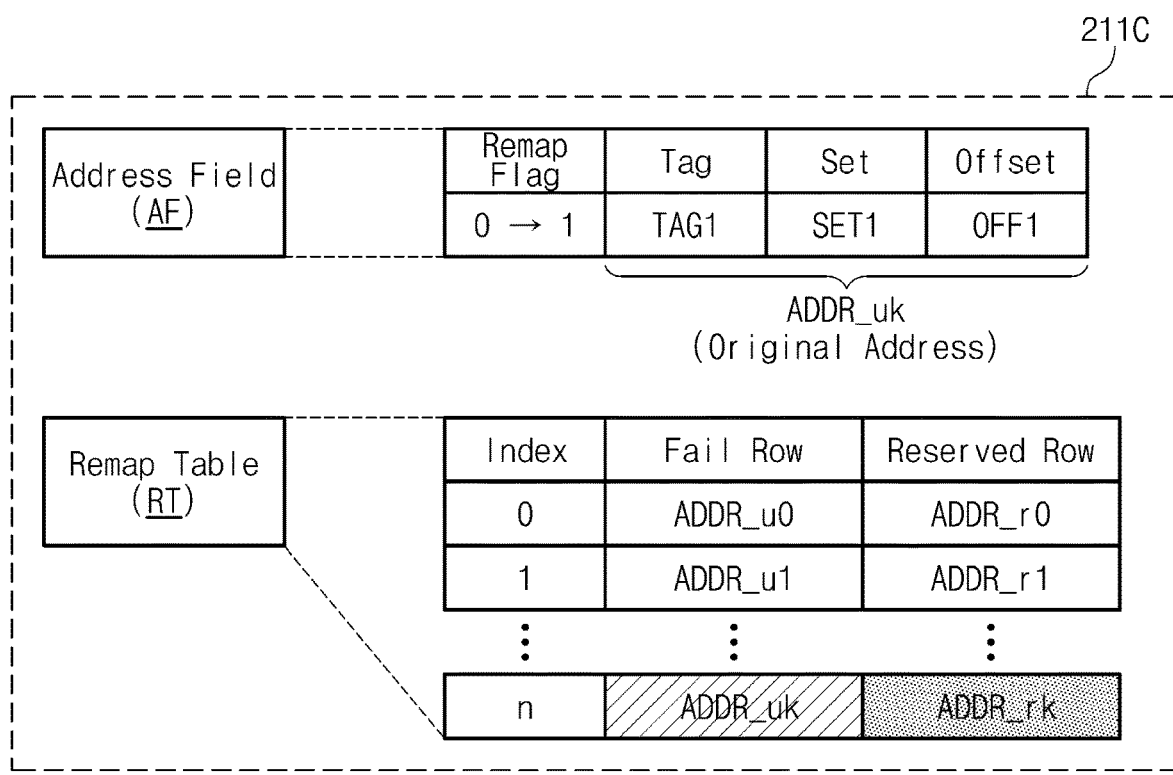
FIG. 13B illustrates another diagram descriptive of an operation according to the flowchart of FIG. 12.

FIG. 12 illustrates a flowchart of an indirect repair operation of a storage controller of FIG. 11. FIGS. 13A and 13B are diagrams descriptive of an operation according to the flowchart of FIG. 12. In an exemplary embodiment, the flowchart of FIG. 12 may be an embodiment associated with operation S15 of FIG. 3. That is, an operation according to the flowchart of FIG. 12 may be performed when a fail row is detected from the DRAM device 120.

Referring to FIGS. 11 and 12, in operation S211 the storage controller 110 remaps a fail address corresponding to the fail row into a reserved address (i.e., into a reserved row). For example, as illustrated in FIG. 13A, the storage controller 110 may recognize both a user area and a reserved area of the DRAM device 120. That is, the storage device 210 may recognize an area corresponding to 0-th to n-th addresses ADDR_u0 to ADDR_un of the DRAM device 120 as a user area and may recognize an area corresponding to 0-th to m-th addresses ADDR_r0 to ADDR_rm of the DRAM device 120 as a reserved area.

The user area may indicate an area to be accessed in a normal operation of the storage device 210. The reserved area may indicate an area recognized by the storage controller 210 or an area not to be accessed in a normal access operation. In other words, the storage device 210 (in particular, the processor 212) may generate an address (i.e., ADDR_u0 to ADDR_un) included in the user area as an original address for the purpose of accessing the DRAM device 120.

In the case where a fail row occurs in the user area, the storage controller 210 remaps an area corresponding to the fail row into a reserved row of the reserved area. For example, as illustrated in FIG. 13A, in the case where a row corresponding to the address ADDR_uk of the user area is detected as a fail row, the DRAM access manager 211c remaps (i.e., performs redirection) the user address ADDR_uk of the user area into the reserved address ADDR_rk of the reserved area.

In operation S212, the storage controller 210 updates the remap table and an address field. For example, as illustrated in FIG. 13B, the DRAM access manager 211c may include an address field AF and a remap table RT. As described above, the address field AF may include remap flag information about each row of the DRAM device 120. The remap table RT may include information about a mapping relationship between a fail address corresponding to a fail row and a reserved address corresponding to a reserved row.

As described with reference to FIG. 13A, in the case where the row corresponding to the user address ADDR_uk is a fail row and the user address ADDR_uk is remapped into the reserved address ADDR_rk, the storage controller 210 may set the k-th address ADDR_uk of the user area to the fail row and may set the k-th address ADDR_rk of the reserved area to the reserved row. That is, the storage controller 210 may update the remap table RT based on information about the fail row of the user area and the remapped reserved row.

In an exemplary embodiment, with regard to the address field AF, the storage controller 210 may change a value of the remap flag associated with the user address ADDR_uk from "0" to "1". In an exemplary embodiment, the case where the remap flag is "1" may indicate that a relevant address is remapped into a reserved area; the case where the remap flag is "0" may indicate that a relevant address is not remapped into a reserved area.

Figure 14:
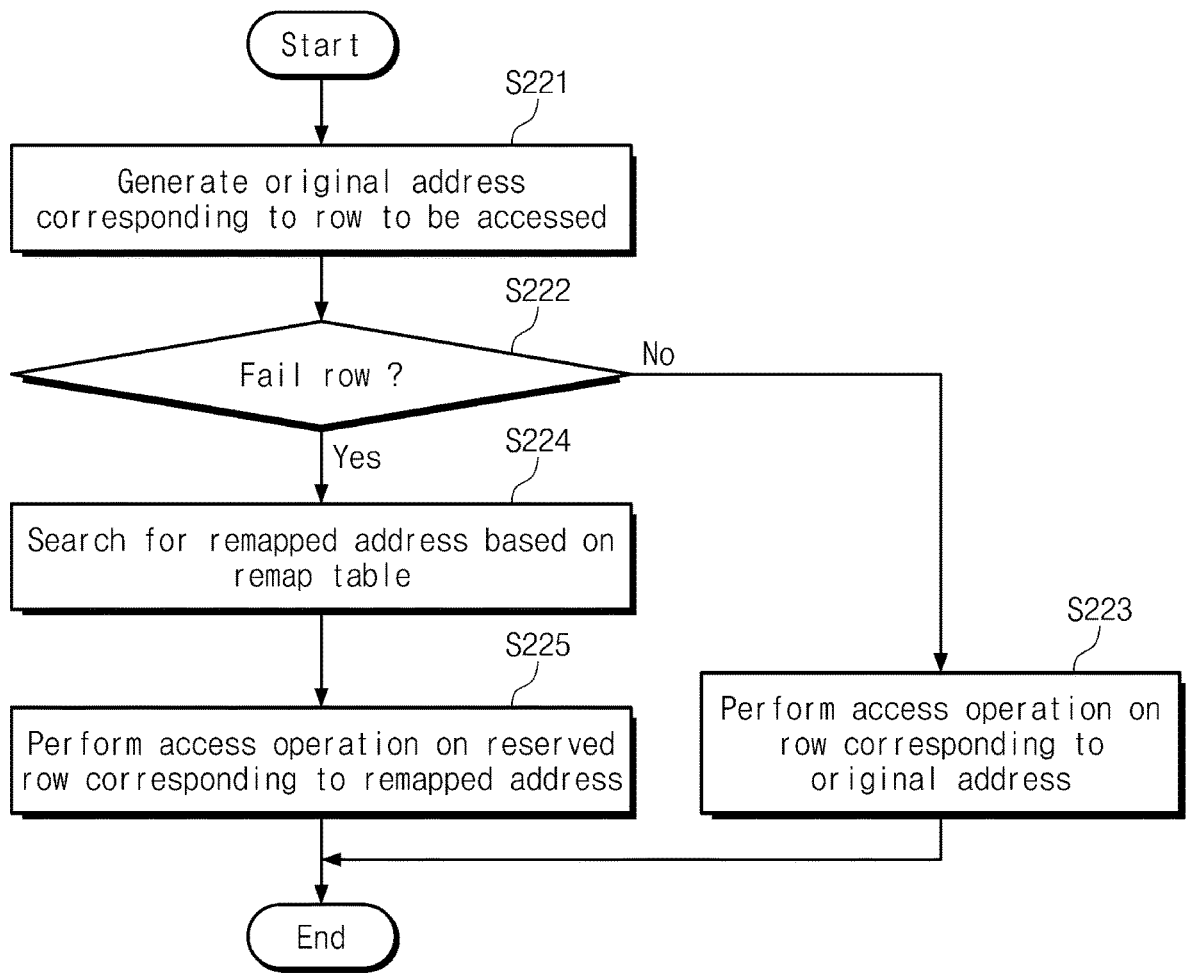
FIG. 14 illustrates a flowchart of an access operation associated with a DRAM device of a storage controller of FIG. 11.

FIG. 14 illustrates a flowchart of an access operation associated with a DRAM device of a storage controller of FIG. 11. Referring to FIGS. 11 and 14, in operation S221 the storage controller 210 generates an original address corresponding to a row to be accessed. For example, the processor 212 of the storage controller 210 may generate an original address for accessing the DRAM device 120. In an exemplary embodiment, the original address may be an address included in the addresses ADDR_u0 to ADDR_un of the user area described with reference to FIG. 13A. That is, the processor 212 may be configured to access the user area of the DRAM device 120.

In operation S222, the storage controller 210 determines whether a row corresponding to the original address is a fail row. For example, the storage controller 210 may check the remap flag of the address field AF associated with the original address. In the case where the remap flag is "0", the storage controller 210 determines that the row corresponding to the original row is not a fail row (No in S222). In this case, in operation S223 the storage controller 210 performs an access operation on the row (i.e., a row of the user area) corresponding to the original address.

In the case where the remap flag corresponding to the original address is "1", the storage controller 210 determines that the row corresponding to the original row is a fail row (Yes in S222). In this case, in operation S224 the storage controller 210 searched for a remapped address corresponding to the original address based on the remap table RT. For example, as described with reference to FIG. 13B, the remap table RT may include information about a relationship between the original address associated with the fail row and a remapped address associated with a reserved row. That is, the storage controller 210 may search for the remapped address corresponding to the original address from the remap table RT.

In operation S225, the storage controller 210 performs an access operation on the reserved row corresponding to the remapped address.

As described above, according to embodiments of the inventive concepts, a fail row of the DRAM device 120 may be remapped into a reserved area of the DRAM device 120 by using a cache layer structure instead of the direct repair operation of the DRAM device 120. Accordingly, while the storage device is being driven, even though a fail row is detected in the DRAM device 120, the DRAM device 120 or the storage device may operate normally.

Figure 15:
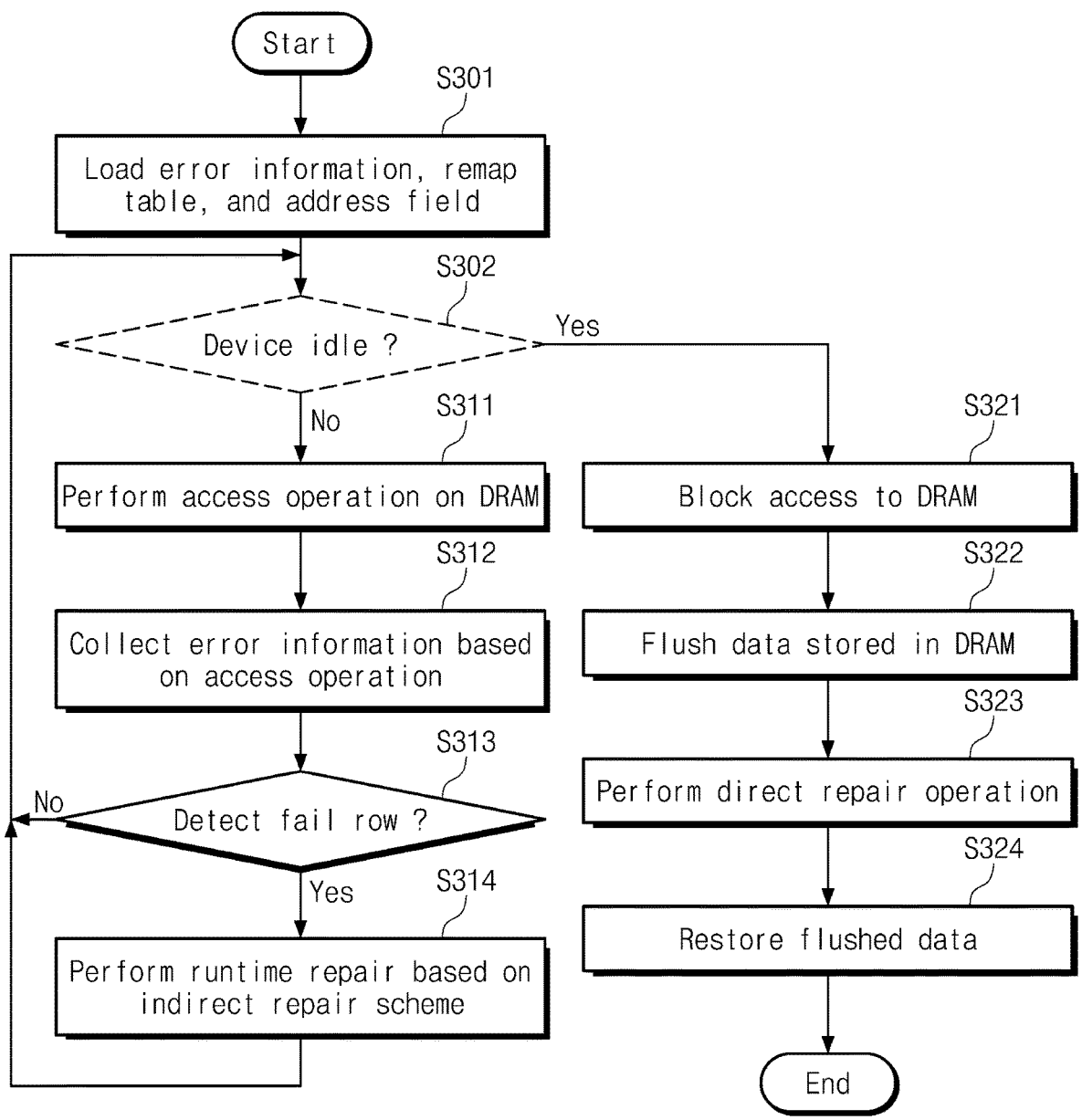
FIG. 15 illustrates a flowchart of a runtime repair operation according to an embodiment of the inventive concepts.

FIG. 15 illustrates a flowchart of a runtime repair operation according to an embodiment of the inventive concepts. In this embodiment, a runtime repair operation in which a direct repair operation and an indirect repair operation are combined will be described with reference to FIG. 15.

Referring to FIGS. 11 and 15, in operation S301 the storage controller 210 loads accumulated error information, a remap table, and an address field. For example, the accumulated error information may indicate the number of error bits accumulated with respect to each row of the DRAM device 120 as described with reference to FIG. 4, the remap table may indicate a mapping relationship between an address of a fail row and a remapped address as described with reference to FIG. 13B, and the address field may indicate information about an address and a corresponding remap flag as described with reference to FIG. 13B.

In an exemplary embodiment, the pieces of information may be periodically flushed to a particular area (e.g., a meta area) of the nonvolatile memory device 130 for the purpose of maintaining data. The storage controller 210 may load the above-described information from the nonvolatile memory device 130 in an initialization operation of the storage controller 210. In an exemplary embodiment, the loaded information may be stored to the SRAM 213, and may be managed by the processor 212 or the DRAM control unit 211.

In operation S302, the storage controller 210 determines whether a device is idle (i.e., in an idle state). In the case where the device is not idle (No in S302), the storage controller 210 performs operation S311 to operation S314. Operation S311 to operation S313 may be similar to operation S12 to operation S14 of FIG. 3, and thus, detailed description thereof will not be repeated here. Operation S314 is similar to the indirect repair operation described with reference to FIG. 12, and thus, additional description will be omitted to avoid redundancy.

In the case where the device is idle (Yes in S302), the storage controller 210 performs operation S321 to operation S324. Operation S321 to operation S324 may be similar to operation S111 to operation S114 (i.e., the direct repair operation) of FIG. 5, and thus, a detailed description thereof will not be repeated here.

That is, in the case where a device is not idle and a fail row is detected in the DRAM device 120, the storage controller 210 may perform the indirect repair operation. As described above, the indirect repair operation may not accompany operations such as an access block operation to the DRAM device 120 and a data backup operation, thereby preventing additional reduction of performance. However, in the case where the device is idle, the storage controller 210 may perform the direct repair operation. In this case, the storage controller 210 may perform a direct repair operation on remapped addresses of the remap table RT as well as the detected fail row.

In an exemplary embodiment, operation S302 as indicated in FIG. 15 by dotted line may be performed between operation S301 and operation S311/S321 and while the storage device operates. That is, the storage controller 210 may continuously determine whether a device is idle, while the storage device operates, thus performing the indirect repair operation or the direct repair operation.

Although not illustrated in FIG. 15, in an exemplary embodiment, in the case where the number of remapped addresses included in the remap table RT is not smaller than a reference value, the storage controller 210 may perform the direct repair operation.

Figure 16:
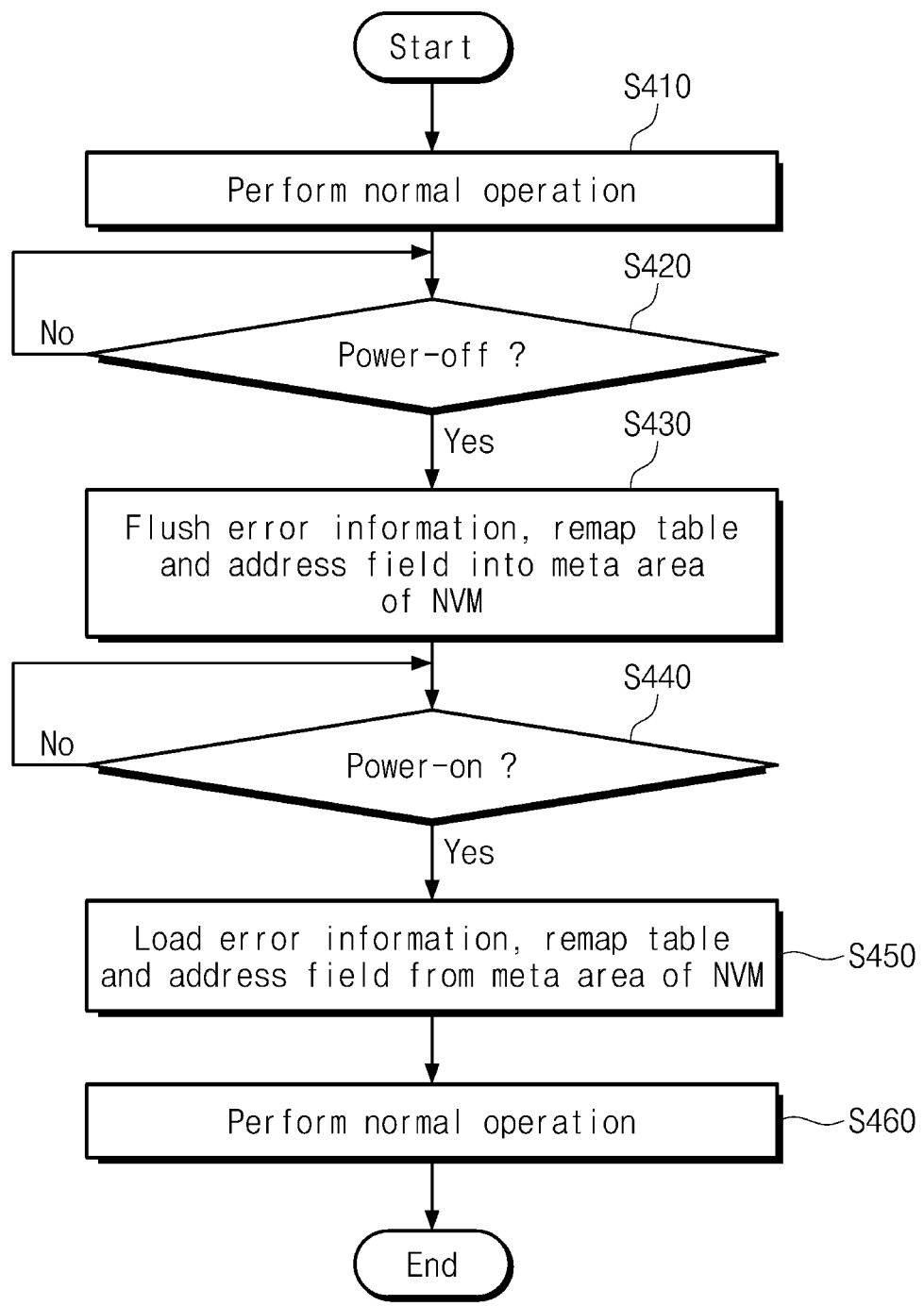
FIG. 16 illustrates a flowchart of an operation of a storage controller according to an embodiment of the inventive concepts.

FIG. 16 illustrates a flowchart of an operation of a storage controller according to an embodiment of the inventive concepts. Referring to FIGS. 11 and 16, in operation S410, the storage controller 210 performs a normal operation. In this case, the normal operation may include various operations associated with the storage device or the runtime repair operations described with reference to FIGS. 1 to 13.

In operation S420, the storage controller 210 determines whether power is turned off. For example, power which is provided to the storage device may be turned off under control of a host, or sudden power off (SPO) may occur due to various causes.

In the case where a power is turned off (Yes in S420), in operation S430 the storage controller 210 flushes accumulated error information, a remap table, and an address field to a meta area of the nonvolatile memory device 130. In an exemplary embodiment, the storage controller 210 may flush the above-described information to the nonvolatile memory device 130 together with important data (e.g., a mapping table and meta information) stored in the DRAM device 120. In the case where power is not turned off (No in S420), operation may loop back to operation S420.

In operation S440, the storage controller 210 determines whether a power is turned on. For example, after a power is turned off, the power may be again provided from a host (Yes in S440). In this case, in operation S450 the storage controller 210 loads the flushed information (e.g., accumulated error information, a remap table, and an address field) from the meta area of the nonvolatile memory device 130. The loaded information may be stored to the SRAM 213, and may be managed by the processor 212 or the DRAM control unit 211. In an exemplary embodiment, the above-described loading operation may be performed during an initialization operation of the storage controller 210. In the case where power is not turned on (No in S440), operation may loop back to operation S440.

Afterwards, in operation S460, the storage controller 210 performs a normal operation. For example, the storage controller 210 may perform the runtime repair operation described with reference to FIGS. 1 to 15 based on the loaded information.

As described above, a storage controller according to embodiments of the inventive concepts may manage accumulated error information about a DRAM device and may detect a fail row of the DRAM device based on the accumulated error information. The storage controller may repair the fail row by performing a runtime repair operation on the detected fail row. In an exemplary embodiment, since information such as accumulated error information, a remap table, and an address field should be maintained to detect a fail row or to perform a runtime repair operation, as described with reference to FIG. 16, the information may be flushed to a nonvolatile memory device at power-off or may be flushed to the nonvolatile memory device periodically or randomly.

Figure 17:
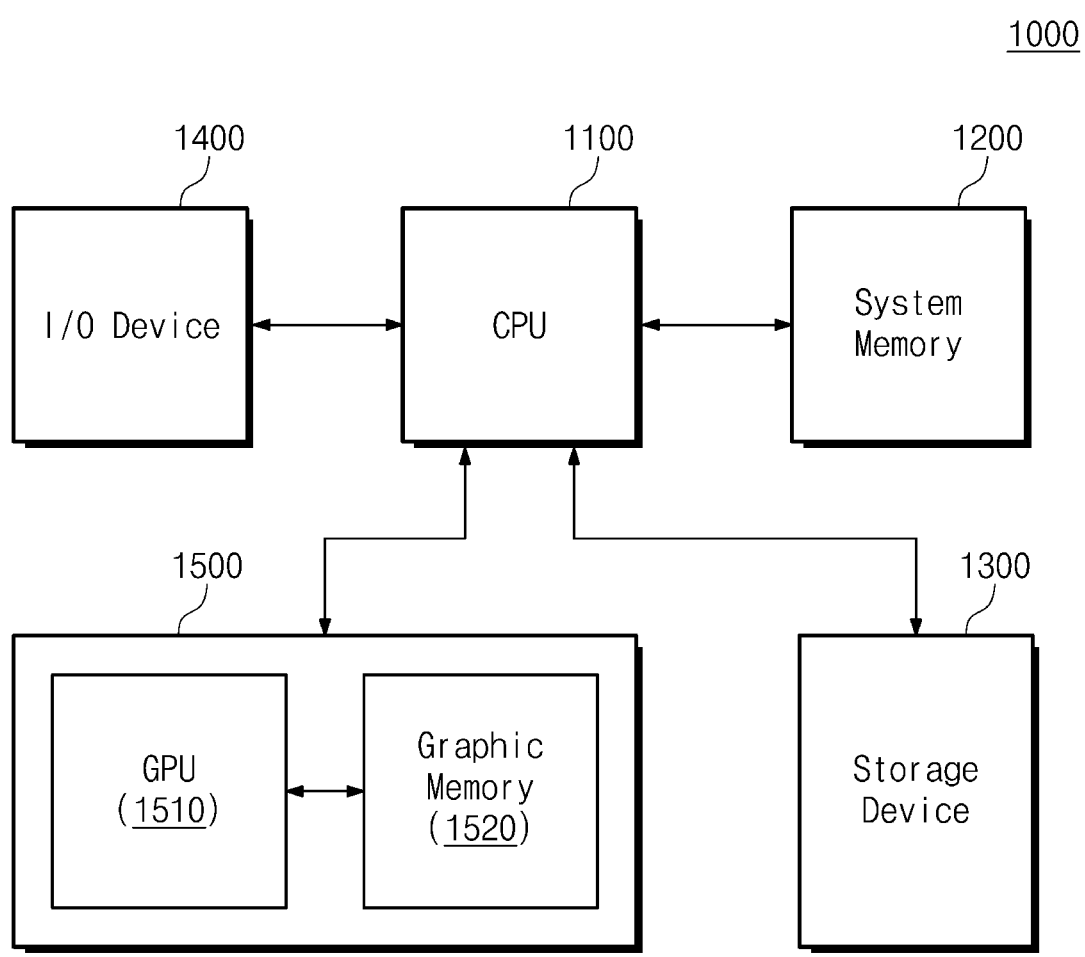
FIG. 17 illustrates a block diagram illustrating a user system to which a storage device according to an embodiment of the inventive concepts is applied.

FIG. 17 illustrates a block diagram of a user system to which a storage device according to embodiments of the inventive concepts is applied. Referring to FIG. 17, a user system 1000 includes a central processing unit (CPU) 1100, a system memory 1200, a storage device 1300, an input/output device 1400, and a graphic device 1500.

The CPU 1100 may perform operations such as for example instruction operations, instruction decodes, or instruction controls, which are requested by the user system 1000. The system memory 1200 may be used as a buffer memory, a cache memory, or a main memory of the CPU 1100. In an exemplary embodiment, the system memory 1200 may include a DRAM device. The CPU 1100 and the system memory 1200 may be configured to perform the runtime repair operation described with reference to FIGS. 1 to 16. That is, while the user system 1000 is being driven, a fail row may be detected from the system memory 1200, and a runtime repair operation may be performed on the detected fail row.

The storage device 1300 may store data which is used in the user system 1000. The storage device 1300 may be implemented as a nonvolatile semiconductor memory device such as for example phase-change RAM (PRAM), magnetic RAM (MRAM), resistive RAM (RRAM), a NAND flash memory, a NOR flash memory, or three-dimensional NAND flash memory, or the like. The storage device 1300 may be a high-capacity storage medium. In an exemplary embodiment, the storage device 1300 may be a storage device which is based on the embodiments described with reference to FIGS. 1 to 16.

The input/output device 1400 may include devices which input data or an instruction to the user system 1000 or output data to an external device. In an exemplary embodiment, the input/output device 1400 may include user input interfaces such as for example a keyboard, a keypad, a button, a touch panel, a touch screen, a touch pad, a touch ball, a camera, a microphone, a gyroscope sensor, a vibration sensor, and a piezoelectric element, or the like. The input/output device 1400 may further include user output interfaces such as for example a liquid crystal display (LCD), an organic light-emitting diode (OLED) display device, an active matrix OLED (AMOLED) display device, a light-emitting diode (LED), a speaker, and a motor, or the like.

The graphic device 1500 may be a device for displaying an operation result of the CPU 1100. The graphic device 1500 may include a graphics processing unit (GPU) 1510 and a graphic memory 1520. The GPU 1510 may convert a data signal provided from the CPU 1100 to an image signal. The GPU 1510 may perform various operations for graphics processing.

The graphic memory 1520 may be a buffer memory or a cache memory which temporarily stores information required for the GPU 1510 to operate. In an exemplary embodiment, the graphic memory 1520 may include a DRAM device. The GPU 1510 and the graphic memory 1520 may be configured to perform the runtime repair operation described with reference to FIGS. 1 to 16. That is, while the graphic device 1500 is being driven, a fail row may be detected from the system memory 1200, and a runtime repair operation may be performed on the detected fail row.

According to the inventive concepts, a runtime repair operation may be performed on a fail row of a DRAM device occurring while a storage device is driven. That is, even though a fail row occurs at the DRAM device while the storage device including the DRAM device is driven, the DRAM device or the storage device may operate normally. Accordingly, a storage device with improved reliability and improved lifespan and an operation method thereof are provided.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. An operation method of a storage device including a nonvolatile memory device, a dynamic random access memory (DRAM) device including a plurality of rows, and a storage controller, the method comprising:
  performing, by the storage controller, an access operation on the DRAM device;
  collecting, by the storage controller, accumulated error information about the DRAM device based on the access operation;
  detecting, by the storage controller, a fail row from among the plurality of rows of the DRAM device based on the accumulated error information;
  performing, by the storage controller, a runtime repair operation on the fail row;
  storing the accumulated error information in a RAM of the storage controller;
  flushing the accumulated error information stored in the RAM to the nonvolatile memory device when the storage device is powered off; and
  loading the accumulated error information from the nonvolatile memory device to the RAM when the storage device is powered on,
  wherein the performing of the runtime repair operation comprises
  remapping the fail row of the DRAM device into a reserved row of a reserved area in the DRAM device, and
  updating a remap table based on a fail address corresponding to the fail row and a reserved address corresponding to the reserved row.

2. The method of claim 1, wherein the access operation includes an operation of reading data from the DRAM device, and an error detection and correction operation associated with the read data.

3. The method of claim 2, wherein the accumulated error information indicates an accumulated count of error bits detected by the error detection and correction operation with respect to each of the plurality of rows of the DRAM device.

4. The method of claim 3, wherein the fail row is a row from among the plurality of rows that has an accumulated error bit count greater than a reference value.

5. The method of claim 1, wherein the performing of the runtime repair operation comprises:
  flushing partial data from among data stored in the DRAM device or whole data stored in the DRAM device to the nonvolatile memory device;
  performing a post package repair operation on the fail row of the DRAM device; and
  restoring the partial data or the whole data flushed to the nonvolatile memory device to the DRAM device after the post package repair operation.

6. The method of claim 5, wherein the performing of the post package repair operation comprises using a mode register set command, address signals, an activate command, an auto precharge write command, and a precharge command.

7. The method of claim 6, wherein the partial data is data stored in banks from among a plurality of banks of the DRAM device that include the fail row.

8. The method of claim 1, further comprising:
  generating, by the storage controller, an original address associated with a user area of the DRAM device;
  accessing, by the storage controller, the reserved area based on the remap table when a row from among the plurality of rows corresponding to the original address is the fail row; and
  accessing, by the storage controller, the user area corresponding to the original address when the row corresponding to the original address is not the fail row.

9. The method of claim 1, further comprising:
  performing a post package repair operation on the DRAM device based on the remap table, during an idle state of the storage device.

10. A storage device comprising:
  a nonvolatile memory device;
  a dynamic random access memory (DRAM) device; and
  a storage controller configured to control the nonvolatile memory device and the DRAM device,
  wherein the storage controller comprises
  a DRAM error correction unit configured to perform an error detection and correction operation on data read from the DRAM device,
  a repair manager configured to manage accumulated error information based on an error detected by the DRAM error correction unit, to detect a fail row of the DRAM device based on the accumulated error information, and to perform a runtime repair operation on the fail row, and
  a memory configured to store the accumulated error information,
  wherein the accumulated error information stored in the memory is periodically flushed to the nonvolatile memory device.

11. The storage device of claim 10, wherein the repair manager is configured to perform the runtime repair operation by flushing partial data from among data stored in the DRAM device or whole data stored in the DRAM device to the nonvolatile memory device, performing a post package repair operation on the fail row of the DRAM device to provide a repaired row, and restoring the partial data or the whole data flushed into the nonvolatile memory device to the DRAM device including the repaired row.

12. The storage device of claim 11, wherein the DRAM device comprises:
  a fuse circuit configured to receive an address from the storage controller, and to output any one of the address and a conversion address obtained by converting the address, depending on fuse-setting of the fuse circuit;
  a memory cell array including normal cells and redundancy cells;
  a row decoder connected with the normal cells through normal word lines and connected with the redundancy cells through redundancy word lines, the row decoder configured to select any one of the normal word lines in response to the address and to select any one of the redundancy word lines in response to the conversion address;
  a column decoder connected with the memory cell array through bit lines; and
  a control logic circuit configured to perform fuse-setting of the fuse circuit by the runtime repair operation of the storage controller.

13. The storage device of claim 10, wherein the DRAM device includes a user area and a reserved area,
  wherein the fail row is included in the user area, and
  wherein the repair manager is configured to remap an original address corresponding to the fail row into a reserved address corresponding to one reserved row of the reserved area.

14. The storage device of claim 13, wherein the storage controller further comprises:
  a processor configured to access the DRAM device by generating the original address; and
  a DRAM access manager configured to output the reserved address in a case where the original address corresponds to the fail row.

15. An operation method of a storage device which includes a nonvolatile memory device, a volatile memory device, and a storage controller configured to control the nonvolatile memory device and the volatile memory device, the method comprising:
- reading, by the storage controller, data from the volatile memory device;
- performing, by the storage controller, an error detection and correction operation on the read data;
- updating, by the storage controller, accumulated error information about each of a plurality of rows of the volatile memory device based on a result of the error detection and correction operation;
- detecting, by the storage controller, a fail row of the volatile memory device based on the updated accumulated error information; and
- performing, by the storage controller, a runtime repair operation on the fail row,
- wherein the performing of the runtime repair operation comprises remapping the fail row into a reserved row of a reserved area in the volatile memory device and updating a remap table based on an original address corresponding to the fail row and a remapped address of the reserved row, while the storage device operates,
- wherein the accumulated error information is stored in a memory of the storage controller, and
- wherein the accumulated error information stored in the memory is periodically flushed to the nonvolatile memory device.

16. The method of claim 15, wherein the performing of the runtime repair operation comprises:
- flushing partial data from among data stored in the volatile memory device or whole data stored in the volatile memory device to the nonvolatile memory device;
- restoring the fail row by performing a post package repair operation on the volatile memory device to provide a repaired row; and
- restoring the partial data or the whole data flushed into the nonvolatile memory device to the volatile memory device including the repaired row.

* * * * *